US007064265B2

(12) United States Patent  
Cochrane

(10) Patent No.: US 7,064,265 B2
(45) Date of Patent: Jun. 20, 2006

(54) REDUCED-GASKET EMI-SHIELDING SOLUTIONS FOR HARD DISK DRIVES AND OTHER COMPUTER COMPONENTS

(75) Inventor: Paul Douglas Cochrane, Union City, CA (US)

(73) Assignee: Stealthdrive LLC, Washington, DC (US)

( * ) Notice: Subject to any disclaimer, the term of this patent is extended or adjusted under 35 U.S.C. 154(b) by 94 days.

(21) Appl. No.: 11/012,896

(22) Filed: Dec. 15, 2004

(65) Prior Publication Data

US 2005/0205279 A1 Sep. 22, 2005

Related U.S. Application Data

(63) Continuation-in-part of application No. 29/216,893, filed on Nov. 9, 2004, and a continuation-in-part of application No. 10/924,339, filed on Aug. 23, 2004, and a continuation-in-part of application No. 10/711,104, filed on Aug. 23, 2004, now abandoned.

(60) Provisional application No. 60/593,072, filed on Dec. 7, 2004, provisional application No. 60/522,626, filed on Oct. 21, 2004, provisional application No. 60/554,364, filed on Mar. 19, 2004.

(51) Int. Cl.
*H05K 9/00* (2006.01)

(52) U.S. Cl. .................................... 174/35 R; 361/685
(58) Field of Classification Search .............. 174/35 R; 361/816, 818, 800, 685
See application file for complete search history.

(56) References Cited

U.S. PATENT DOCUMENTS

| | | | |
|---|---|---|---|
| 4,631,641 A | | 12/1986 | Brombal et al. |
| 4,759,466 A | * | 7/1988 | Chase et al. ................ 220/4.02 |
| 6,870,092 B1 | * | 3/2005 | Lambert et al. ........ 174/35 GC |
| 6,879,495 B1 | * | 4/2005 | Jiang .......................... 361/818 |
| 2005/0029000 A1 | * | 2/2005 | Aisenbrey .............. 174/35 MS |

OTHER PUBLICATIONS

Search No. Question No.- 1272050.009, TORP.5A, One-Hit Stamping/Cutting for EMI Shielding, Gene O'Neil, Investigator, Dec. 23, 2004 (28 pages).
Question No.- 1272050.008, TORP5.A, One-Hit Stamping/Cutting for EMI Shielding, Gene O. Neil, Investigator, Dec. 23, 2004 (8 pages).
Jan Carlsson and Per-Simon Kildal, "Analysis of Corregated Soft Edges to Reduce Scattering from Gaps Between Reflecting Panels," IEEE, 1993.
Carlsson and Kildal, "Transmission Through Corregated Slots," IEEE Transactions on Electromagnetic Compatibility, vol., 37, No. 1, Feb. 1995.

* cited by examiner

*Primary Examiner*—Hung V. Ngo
(74) *Attorney, Agent, or Firm*—David Bogart Dort; Dort Partners IP PLLC

(57) ABSTRACT

The present invention provides a configuration of a hard-drive containment system and method for manufacture in which a polymer including an electromagnetic interference shielding (EMI shielding) is configured such that shielding gaskets may be reduced or eliminated completely. Patterned sinusoidal "cuts" that are molded into one or more sides of a disk-drive container made of Premier® or another EMI shielding polymer material that provides sufficient EMI shielding, such that further shielding, such that the need for gaskets is reduced or eliminated.

10 Claims, 22 Drawing Sheets

FIG. 18B (prior art)   Example of mechanical design to use a gasket
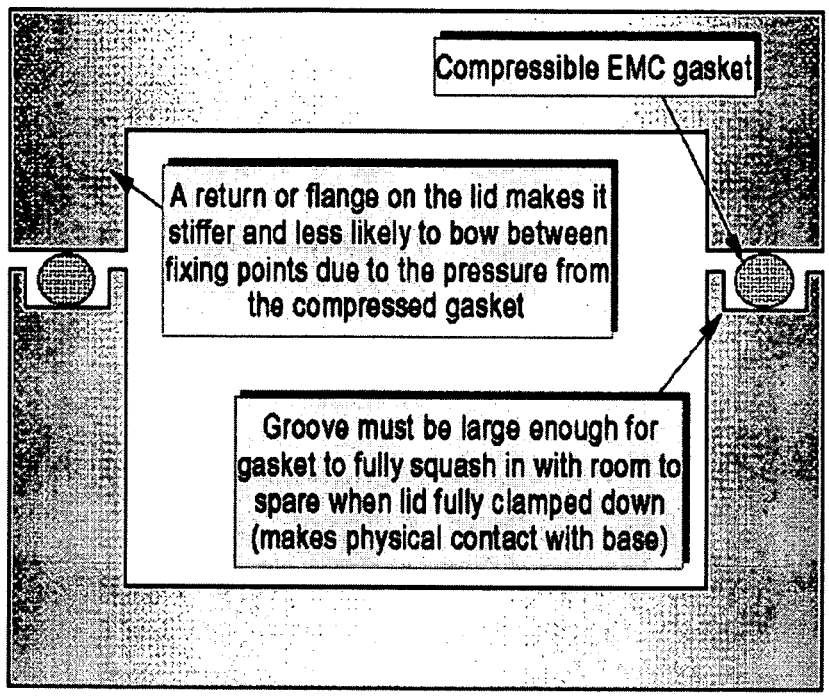
FIG. 18C (prior art)
The "dirty box" method
May be used for displays and other panel mounted items that don't need additional shielding
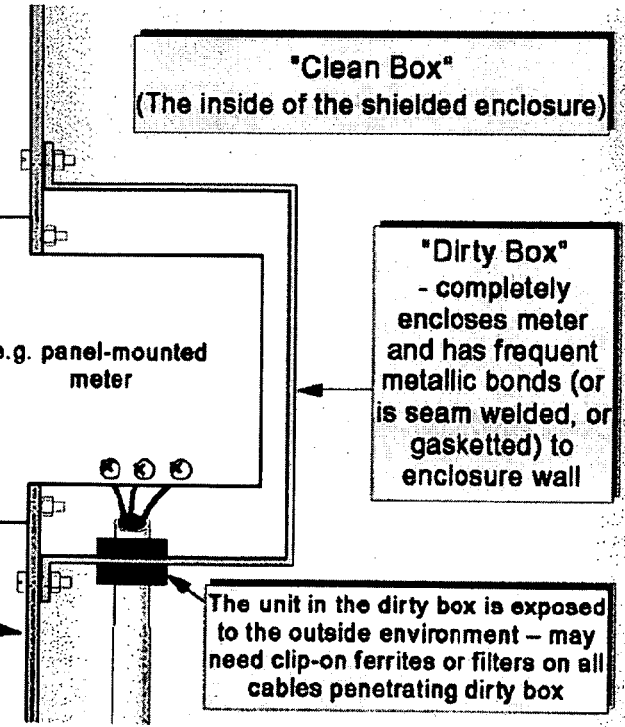

(prior art) Shield gaps make good antenna (prior art) Rule of thumb for the SE of apertures For other aperture sizes: divide frequency axis by the ratio of the diagonals
(e.g. for a doubled diagonal: halve the frequency axis)

REDUCED-GASKET EMI-SHIELDING SOLUTIONS FOR HARD DISK DRIVES AND OTHER COMPUTER COMPONENTS

REFERENCE TO PRIORITY DOCUMENTS

The present application is a continuation-in-part and claims priority under 35 USC §120 to U.S. Design Application No. 29/216,893, filed Nov. 9, 2004, entitled FACE PLATE FOR PORTABLE HARD DISK DRIVE CONTAINER, and also claims priority under 35 USC §119(e) to U.S. Provisional Application Ser. No. 60/593,072, filed Dec. 7, 2004, entitled "Reduced-Gasket EMI-Shielding Solutions for Hard Drive Containers" and 60/522,626, filed Oct. 21, 2004 and entitled REDUCED-WEIGHT HARD DISK DRIVE REMOVABLE PROTECTIVE CONTAINER WITH COST-EFFECTIVE MANUFACTURING PROCESS, all of which are incorporated by reference for all purposes. This Application also is a continuation-in-part and claims priority under 35 USC §120 to U.S. application Ser. Nos. 10/711,104 and 10/924,339, filed Aug. 23, 2004 and entitled LIFE EXTENSION IN HARD DISK DRIVES THROUGH VIBRATION AND THERMAL DAMPENING USING POLYMER SPRINGS, which claim priority under 35 USC §119(e) to U.S. Provisional Application Ser. No. 60/554,364, filed Mar. 19, 2004 and entitled HARD DRIVE HAVEN, all of which are incorporated by reference.

BACKGROUND

The following background section is, in part, reprinted from "*Design Techniques for EMC—Part 4 Shielding*" by Eur Ing Keith Armstrong, Cherry Clough Consultants, Associate of EMC-UK.

A complete volumetric shield is often known as a "Faraday Cage", although this can give the impression that a cage full of holes (like Mr Faraday's original) is acceptable, which it generally is not. There is a cost hierarchy to shielding which makes it commercially important to consider shielding early in the design process. Shields may be fitted around: individual ICs—example cost 25P; segregated areas of PCB circuitry-example cost £1; whole PCBs-example cost £10□ sub-assemblies and modules-example cost £15 Complete products example cost £100□assemblies (e.g. industrial control and instrumentation cubicles)-example cost £1,000□rooms-example cost £10,0000 and buildings—example cost £100,000.

Shielding always adds cost and weight, so it is always best to use the other techniques described in this series to improve EMC and reduce the need for shielding. Even when it is hoped to avoid shielding altogether, it is best to allow for Murphy's Law and design from the very conception so that shielding can be added later if necessary. A degree of shielding can also be achieved by keeping all conductors and components very close to a solid metal sheet. Ground-planed PCBs populated entirely by low-profile surface mounted devices are therefore recommended for their EMC advantages.

A useful degree of shielding can be achieved in electronic assemblies firstly, by keeping their internal electronic units and cables very close to an earthed metal surface at all times, and secondly, by bonding their earths directly to the metal surface instead of (or as well as) using a safety star earthing system based on green/yellow wires. This technique usually uses zinc-plated mounting plates or chassis, and can help avoid the need for high values of enclosure SE.

Many textbooks have been written on the subject of how shields work, and it is not intended to repeat them here. However, a few broad concepts will help. A shield puts an impedance discontinuity in the path of a propagating radiated electromagnetic wave, reflecting it and/or absorbing it. This is conceptually very similar to the way in which filters work—they put an impedance discontinuity in the path of an unwanted conducted signal. The greater the impedance ratio, the greater the SE.

At thicknesses of 0.5 mm or over, most normal fabrication metals provide good SE above 1 MHz and excellent SE above 100 MHz. Problems with metal shields are mostly caused by thin materials, frequencies below 1 MHz, and apertures.

It is generally best to allow a large distance between the circuits that are shielded and the walls of their shield. The emitted fields outside of the shield, and the fields that the devices are subjected to, will generally be more "diluted" the larger the shielded volume.

When enclosures have parallel walls opposite each other, standing waves can build up at resonant frequencies and these can cause SE problems. Irregular shaped enclosures, or ones with curved or non-parallel walls will help prevent resonances. When opposing shield walls are parallel, it is desirable to prevent resonances from occurring at the same frequencies due to the width, height, or length. So in order to avoid cubic enclosures, rectangular cross-sections can be used instead of square ones, and try to avoid dimensions that are simple multiples of each other. For example, if the length is 1.5 times the width, the second resonance of the width should coincide with the third resonance of the length. Best to use irrationally ratio'd dimensions, such as those provided by the Fibonacci series.

Fields come in two flavours: electric (E) and magnetic (M). Electromagnetic fields consist of E and M fields in a given ratio (giving a wave impedance E/M of 377Ω in air). Electric fields are easily stopped by thin metal foils since the mechanism for electric field shielding is one of charge re-distribution at a conductive boundary; therefore, almost anything with a high conductivity (low resistance) will present suitably low impedance. At high frequencies, considerable displacement currents can result from the rapid rate of charge re-distribution, but even thin aluminium can manage this well. However, magnetic fields are much more difficult to stop. They need to generate eddy currents inside the shield material to create magnetic fields that oppose the impinging field. Thin aluminium is not going to be very suitable for this purpose, and the depth of current penetration required for a given SE depends on the frequency of the field. The SE also depends on the characteristics of the metal used for the shield which is known as the "skin effect".

The skin depth of the shield material known as the "skin effect" causes the currents caused by the impinging magnetic field to be reduced by approximately 9 dB. Hence a material which was as thick as 3 skin depths would have an approximately 27 dB lower current on its opposite side and have an SE of approximately 27 dB for that M field.

The skin effect is especially important at low frequencies where the fields experienced are more likely to be predominantly magnetic with lower wave impedance than 377Ω. The formula for skin depth is given in most textbooks; however, the formula requires knowledge of the shielding material's conductivity and relative permeability.

Copper and aluminium have over 5 times the conductivity of steel, so are very good at stopping electric fields, but have a relative permeability of 1 (the same as air). Typical mild steel has a relative permeability of around 300 at low frequencies, falling to 1 as frequencies increase above 100 kHz. The higher permeability of mild steel gives it a reduced skin depth, making the reasonable thicknesses better than aluminium for shielding low frequencies. Different grades of steels (especially stainless) have different conductivities and permeabilities, and their skin depths will vary considerably as a result. A good material for a shield will have high conductivity and high permeability, and sufficient thickness to achieve the required number of skin-depths at the lowest frequency of concern. 1 mm thick mild steel plated with pure zinc (say, 10 microns or more) is suitable for many applications.

It is easy to achieve SE figures of 100 dB or more at frequencies above 30 MHz with ordinary constructional metalwork. However, this assumes a perfectly enclosing shield volume with no joints or gaps, which makes assembly of the product rather difficult unless you are prepared to seam-weld it completely and also have no external cables, antennae, or sensors (rather an unusual product). In practice, whether shielding is being done to reduce emissions or to improve immunity, most shield performance is limited by the apertures within it.

Considering apertures as holes in an otherwise perfect shield implies that the apertures act as half-wave resonant "slot antennae". This allows us to make predictions about maximum aperture sizes for a given SE: for a single aperture, SE=20 log($\square$/2d) where $\square$ is the wavelength at the frequency of interest and d is the longest dimension of the aperture. In practice, this assumption may not always be accurate, but it has the virtue of being an easy design tool that is a good framework. It may be possible to refine this formula following practical experiences with the technologies and construction methods used on specific products.

The resonant frequency of a slot antenna is governed by its longest dimension—its diagonal. It makes little difference how wide or narrow an aperture is, or even whether there is a line-of-sight through the aperture.

Even apertures, the thickness of a paint or oxide film, formed by overlapping metal sheets, still radiate (leak) at their resonant frequency just as well as if they were wide enough to poke a finger through. One of the most important EMC issues is keeping the products' internal frequencies internal, so they don't pollute the radio spectrum externally.

The half-wave resonance of slot antennae (expressed in the above rule of thumb: SE=20 log($\square$/2d) using the relationship $v=f\lambda$ (where v is the speed of light: $3.10^8$ metres/sec, $f$ is the frequency in Hz, and $\square$ is the wavelength in metres). We find that a narrow 430 mm long gap along the front edge of a 19-inch rack unit's front panel will be half-wave resonant at around 350 MHz. At this frequency, our example 19" front panel is no longer providing much shielding and removing it entirely might not make much difference.

For an SE of 20 dB at 1 GHz, an aperture no larger than around 16 mm is needed. For 40 dB this would be only 1.6 mm, requiring the gaskets to seal apertures and/or the use of the waveguide below cut-off techniques described later. An actual SE in practice will depend on internal resonances between the walls of the enclosure itself, the proximity of components and conductors to apertures (keep noisy cables such as ribbon cables carrying digital busses well away from shield apertures and joints) and the impedances of the fixings used to assemble the parts of the enclosure, etc.

Wherever possible, it is desirable to break all necessary or unavoidable apertures into a number of smaller ones. Unavoidably long apertures (covers, doors, etc) may need conductive gaskets or spring fingers (or other means of maintaining shield continuity). The SE of a number of small identical apertures nearby each other is (roughly) proportional to their number (SE=20 logn, where n is the number of apertures), so two apertures will be worse by 6 dB, four by 12 dB, 8 by 18 dB, and so on. But when the wavelength at the frequency of concern starts to become comparable with the overall size of the array of small apertures, or when apertures are not near to each other (compared with the wavelength), this crude 6 dB per doubling rule breaks down because of phase cancellation effects.

Apertures placed more than half a wavelength apart do not generally worsen the SEs that achieves individually, but half a wavelength at 100 MHz is 1.5 metres. At such low frequencies on typical products smaller than this, an increased number of apertures will tend to worsen the enclosure's SE.

Apertures don't merely behave as slot antennae. Currents flowing in a shield and forced to divert their path around an aperture will cause it to emit magnetic fields. Voltage differences across an aperture will cause the aperture to emit electric fields. The author has seen dramatic levels of emissions at 130 MHz from a hole no more than 4 mm in diameter (intended for a click-in plastic mounting pillar) in a small PCB-mounted shield over a microcontroller.

The only really sensible way to discover the SE of any complex enclosure with apertures is to model the structure, along with any PCBs and conductors (especially those that might be near any apertures) with a 3-dimensional field solver. Software packages that can do this now have more user-friendly interfaces and run on desktop PCs. Alternatively, you will be able to find a university or design consultancy that has the necessary software and the skills to drive it.

Since an SE will vary strongly with the method and quality of assembly, materials, and internal PCBs and cables, it is always best to allow yourself an SE 'safety margin' of 20 dB. It may also be best to allow yourself at least design-in features that will allow you to improve the SE by at least 20 dB if you have problems with the final design's verification/qualification testing.

The frequency of 50 Hz is problematic, and SE at this frequency with any reasonable thickness of ordinary metals is desirable. Special materials such as Mumetal and Radiometal have very high relative permeabilities, often in the region of 10,000. Their skin depth is correspondingly very small, but they are only effective up to a few tens of kHz. Care must be taken not to knock items made of these materials, as this ruins their permeability and they have to thrown away or else re-annealed in a hydrogen atmosphere. These exotic materials are used rather like channels to divert the magnetic fields away from the volume to be protected. This is a different concept to that used by ordinary shielding.

All metals shield materials with relative permeability greater than 1 can saturate in intense magnetic fields, and then don't work well as shields and often heat up. A steel or Mumetal shield box over a mains transformer to reduce its hum fields can saturate and fail to achieve the desired effect. Often, all that is necessary is to make the box larger so it does not experience such intense local fields. Another shielding technique for low frequency shielding is active cancellation, and at least two companies have developed this technique specifically for stabilizing the images of CRT VDUs in environments polluted by high levels of power frequency magnetic fields.

FIG. 18A shows that if we extend the distance that a wave leaking through an aperture has to travel between surrounding metal walls before it reaches freedom, we can achieve respectable SEs even thought the apertures may be large enough to put your fist through. This very powerful technique is called "waveguide below cut-off". Honeycomb metal constructions are really a number of waveguides below cut-off stacked side-by-side, and are often used as ventilation grilles for shielded rooms, similar to high-SE enclosures.

Like any aperture, a waveguide allows all its impinging fields to pass through when its internal diagonal (g) is half a wavelength. Therefore, the cut-off frequency of our waveguide is given by: $f_{cutoff}$=150,000/g (answer in MHz when g is in mm.) Below its cut-off frequency, a waveguide does not leak like an ordinary aperture (as shown by FIG. 4H) and can provide a great deal of shielding: for $f<0.5f_{cutoff}$ SE is approximately 27d/g where d is the distance through the waveguide the wave has to travel before it is free.

FIG. 18A shows examples of the SE achieved by six different sizes of waveguides below cut-off. Smaller diameter (g) results in a higher cut-off frequency, with a 50 mm (2 inch) diameter achieving full attenuation by 1 GHz. Increased depth (d) results in increased SE, with very high values being readily achieved.

Waveguides below cut-off do not have to be made out of tubes, and can be realized using simple sheet metalwork which folds the depth (d) so as not to increase the size of the product by much. As a technique it is only limited by the imagination, but it must be taken into consideration early in a project as it is usually difficult to retrofit to a failing product not intended to use it. Conductors should never be passed through waveguides below cut-off, as this compromises their effectiveness. Waveguides below cut-off can be usefully applied to plastic shafts (e.g. control knobs) so that they do not compromise the SE where they exit an enclosure. The alternative is to use metal shafts with a circular conductive gasket and suffer the resulting friction and wear. Waveguides below cut-off can avoid the need for continuous strips of gasket, and/or for multiple fixings, and thus save material costs and assembly times.

Gaskets are used to prevent leaky apertures at joints, seams, doors and removable panels. For fit-and-forget assemblies, gasket design is not too difficult, but doors, hatches, covers, and other removable panels create many problems for gaskets, as they must meet a number of conflicting mechanical and electrical requirements, not to mention chemical requirements (to prevent corrosion). Shielding gaskets are sometimes required to be environmental seals as well, adding to the compromise.

FIG. 18B shows a typical gasket design for the door of an industrial cabinet, using a conductive rubber or silicone compound to provide an environmental seal as well as an EMC shield. Spring fingers are often used in such applications as well.

It is worth noting that the green/yellow wire used for safety earthing of a door or panel has no benefits for EMC above a few hundred kHz. This might be extended to a few MHz if a short wide earthing strap is used instead of a long wire.

A huge range of gasket types is available from a number of manufacturers, most of whom also offer customizing services. This observation reveals that no one gasket is suitable for a wide range of applications. Considerations when designing or selecting gaskets include: (1) mechanical compliance, (2) compression set, (3) impedance over a wide range of frequencies, (4) resistance to corrosion (low galvanic EMFs in relation to its mating materials, appropriate for the intended environment), (5) ability to withstand the expected rigours of normal use, (6) shape and preparation of mounting surface, (7) ease of assembly and dis-assembly, (8) environmental sealing, and smoke and fire requirements.

There are four main types of shielding gaskets: (1) conductive polymers (insulating polymers with metal particles in them). These double as environmental seals, have low compression set but need significant contact pressure, making them difficult to use in manually-opened doors without lever assistance; (2) conductively wrapped polymers (polymer foam or tube with a conductive outer coating); These can be very soft and flexible, with low compression set. Some only need low levels of contact pressure. However, they may not make the best environmental seals and their conductive layer may be vulnerable to wear; (3) metal meshes (random or knitted) are generally very stiff but match the impedance of metal enclosures better and so have better SEs than the above types. They have poor environmental sealing performance, but some are now supplied bonded to an environmental seal, so that two types of gaskets may be applied in one operation; (4) spring fingers ("finger stock") are usually made of beryllium copper or stainless steel and can be very compliant. Their greatest use is on modules (and doors) which must be easy to manually extract (open), easy to insert (close), and which have a high level of use. Their wiping contact action helps to achieve a good bond, and their impedance match to metal enclosures is good, but when they don't apply high pressures, maintenance may be required (possibly a smear of petroleum jelly every few years). Spring fingers are also more vulnerable to accidental damage, such as getting caught in a coat sleeve and bending or snapping off. The dimensions of spring fingers and the gaps between them causes inductance, so for high frequencies or critical use a double row may be required, such as can be seen on the doors of most EMC test chambers.

Gaskets need appropriate mechanical provisions made on the product to be effective and easy to assemble. Gaskets simply stuck on a surface and squashed between mating parts may not work as well as is optimal—the more their assembly screws are tightened in an effort to compress the gasket and make a good seal, the more the gaps between the fixings can bow, opening up leaky gaps. This is because of inadequate stiffness in the mating parts, and it is difficult to make the mating parts rigid enough without a groove for the gasket to be squashed into, as shown by FIG. 18B. This groove also helps correctly position and retains the gasket during assembly.

Gasket contact areas must not be painted (unless it is with conductive paint), and the materials used and their preparation and plating must be carefully considered from the point of view of galvanic corrosion. All gasket details and measures must be shown on manufacturing drawings, and all proposed changes to them assessed for their impact on shielding and EMC. It is not uncommon, when painting work is transferred to a different supplier, for gaskets to be made useless because masking information was not put on the drawings. Changes in the painting processes used can also have a deleterious effect (as can different painting operatives) due to varying degrees of overspray into gasket mounting areas which are not masked off.

FIG. 18C shows a large aperture in the wall of the shielded enclosure, using an internal "dirty box" to control the field leakage through the aperture. The joint between the dirty box and the inside of the enclosure wall must be treated the same as any other joint in the shield.

A variety of shielded windows are available, based on two main technologies: (1) thin metal films on plastic sheets, usually indium-tin-oxide (ITO). At film thicknesses of 8 microns and above, optical degradation starts to become unacceptable, and for battery-powered products, the increased backlight power may prove too onerous. The thickness of these films may be insufficient to provide good SEs below 100 MHz; (2) embedded metal meshes, usually a fine mesh of blackened copper wires. For the same optical degradation as a metal film, these provide much higher SEs, but they can suffer from Moiré fringing with the display pixels if the mesh is not sized correctly. One trick is to orient the mesh diagonally.

Honeycomb metal display screens are also available for the very highest shielding performance. These are large numbers of waveguides below cut-off, stacked side by side, and are mostly used in security or military applications. The extremely narrow viewing angle of the waveguides means that the operator's head prevents anyone else from sneaking a look at their displays.

The mesh size must be small enough not to reduce the enclosure's SE too much. The SE of a number of small identical apertures near to each other is (roughly) proportional to their number, n, (SE 20 logn), so two apertures will make SE worse by 6 dB, four by 12 dB. 8 by 18 dB, and so on. For a large number of small apertures typical of a ventilation grille, mesh size will be considerably smaller than one aperture on its own would need to be for the same SE. At higher frequencies where the size of the ventilation aperture exceeds one-quarter of the wavelength, this crude "6 dB per doubling" formula can lead to over-engineering, but no simple rule of thumb exists for this situation.

Waveguides below cut-off allow high air flow rates with high values of SE. Honeycomb metal ventilation shields (consisting of many long narrow hexagonal tubes bonded side-by-side) have been used for this purpose for many years. It is believed that at least one manufacturer of highly shielded 19" rack cabinets claims to use waveguide below cut-off shielding for the top and bottom ventilation apertures that use ordinary sheet metalwork techniques.

The design of shielding for ventilation apertures can be complicated by the need to clean the shield of the dirt deposited on it from the air. Careful air filter design can allow ventilation shields to be welded or otherwise permanently fixed in place.

Plastic enclosures are often used for a pleasing feel and appearance, but can be difficult to shield. Coating the inside of the plastic enclosure with conductive materials such as metal particles in a binder (conductive paint), or with actual metal (plating), is technically demanding and requires attention to detail during the design of the mould tooling if it is to stand a chance of working.

It is often found, when it is discovered that shielding is necessary, that the design of the plastic enclosure does not permit the required SE to be achieved by coating its inner surfaces. The weak points are usually the seams between the plastic parts; they often cannot ensure a leak-tight fit, and usually cannot easily be gasketted. Expensive new mould tools are often needed, with consequent delays to market introduction and to the start of income generation from the new product.

Whenever a plastic case is required for a new product, it is financially vital that consideration be given to achieving the necessary SE right from the start of the design process.

Paint or plating on plastic can never be very thick, so the number of skin-depths achieved can be quite small. Some clever coatings using nickel and other metals have been developed to take advantage of nickel's reasonably high permeability in order to reduce skin depth and achieve better SE.

Other practical problems with painting and plating include making them stick to the plastic substrate over the life of the product in its intended environment. Not easy to do without expert knowledge of the materials and processes. Conductive paint or plating flaking off inside a product can do a lot more than compromise EMC—it can short out conductors, causing unreliable operation and risking fires and electrocution. Painting and plating plastics must be done by experts with long experience in that specialized field.

A special problem with painting or plating plastics is voltage isolation. For class II products (double insulated), adding a conductive layer inside the plastic cases can reduce creepage and clearance distances and compromise electrical safety. Also, for any plastic-cased product, adding a conductive layer to the internal surface of the case can encourage personnel electrostatic discharge (ESD) through seams and joints, possibly replacing a problem of radiated interference with the problem of susceptibility to ESD. For commercial reasons, it is important that careful design of the plastic enclosure occurs from the beginning of the design process if there is any possibility that shielding might eventually be required.

Some companies box cleverly (pun intended) by using thin and unattractive low-cost metal shields on printed circuit boards or around assemblies, making it unnecessary for their pretty plastic case to do double duty as a shield. This can save a great deal of cost and headache, but must be considered from the start of a project or else there will be no room available (or the wrong type of room) to fit such internal metalwork.

Volume-conductive plastics or resins generally use distributed conductive particles or threads in an insulating binder which provides mechanical strength. Sometimes these suffer from forming a "skin" of the basic plastic or resin, making it difficult to achieve good RF bonds without helicoil inserts or similar means. These insulating skins make it difficult to prevent long apertures which are created at joints, and also make it difficult to provide good bonds to the bodies of connectors, glands, and filters. Problems with the consistency of mixing conductive particles and polymer can make enclosures weak in some areas, and lacking in shielding in others.

Materials based on carbon fibres (which are themselves conductive) and self-conductive polymers are starting to become available, but they do not have the high conductivity of metal and so do not give as good an SE for a given thickness. The screens and connectors (or glands) of all screened cables that penetrate a shielded enclosure, and their 360° bonding, are as vital a part of any "Faraday Cage" as the enclosure metalwork itself. The thoughtful assembly and installation of filters for unshielded external cables is also vital to achieve a good SE. Refer to the draft IEC1000-5-6 (95/210789 DC from BSI) for best practices in industrial cabinet shielding (and filtering). Refer to BS IEC 61000-5-2:1998 for best practices in cabling (and earthing).

Returning to our original theme of applying shielding at as low a level of assembly as possible to save costs, we should consider the issues of shielding at the level of the PCB. The ideal PCB-level shield is a totally enclosing metal box with shielded connectors and feedthrough filters mounted in its walls, really just a miniature version of a product-level shielded enclosure as described above. The result is often called a module which can provide extremely high SEs, and is very often used in the RF and microwave worlds.

Lower cost PCB shields are possible, although their SE is not usually as good as a well-designed module. All depend upon a ground plane in a PCB used to provide one side of the shield, so that a simple five-sided box can be assembled on the PCB like any other component. Soldering this five-sided box to the ground plane at a number of points around its circumference creates a "Faraday cage" around the desired area of circuitry. A variety of standard five-sided PCB-mounted shielding boxes are readily available, and companies who specialize in this kind of precision metalwork often make custom designs. Boxes are available with snap-on lids so that adjustments may easily be made, test points accessed, or chips replaced, with the lid off. Such removable lids are usually fitted with spring-fingers all around their circumference to achieve a good SE when they are snapped in place.

Weak points in this method of shielding are obviously the apertures created by the gaps between the ground-plane soldered connections, any apertures in the ground plane (for example clearances around through-leads and via holes), and any other apertures in the five-sided box (for example ventilation, access to adjustable components, displays, etc.) Seam-soldering the edges of a five-sided box to a component-side ground plane can remove one set of apertures, at the cost of a time-consuming manual operation.

For the lowest cost, we want to bring all our signals and power into the shielded area of our PCB as tracks, avoiding wires and cables. This means we need to use the PCB equivalents of bulkhead-mounting shielded connectors, and bulkhead-mounting filters.

The PCB track equivalent of a shielded cable is a track run between two ground planes, often called a "stripline." Sometimes guard tracks are run on both sides of this "shielded track" on the same copper layer. These guard tracks have very frequently via holes bonding them to the top and bottom ground planes. The number of via holes per inch is the limiting factor here, as the gaps between them act as shield apertures (the guard tracks have too much inductance on their own to provide a good SE at high-frequencies). Since the dielectric constant of the PCB material is roughly four times that of air, their frequency axes should be divided by two (the square root of the PCB's dielectric constant). Some designers don't bother with the guard tracks and just use via holes to "channel" the track in question. It may be a good idea to randomly vary the spacings of such rows of via holes around the desired spacing in order to help avoid resonances.

Where striplines enter an area of circuitry enclosed by a shielded box, it is sufficient that their upper and lower ground planes (and any guard tracks) are bonded to the screening can's soldered joints on both sides close to the stripline.

The track which only has a single ground plane layer in parallel, the other side being exposed to the air, is said to be of "microstrip" construction. When a microstrip enters a shielded PCB box, it will suffer an impedance discontinuity due to the wall of the box. If the wavelength of the highest frequency component of the signals in the microstrip is greater than 100 times the thickness of the box wall (or the width of box mounting flange), the discontinuity may be too brief to register. But where this is not the case, some degradation in performance may occur and such signals are best routed using striplines.

All unshielded tracks must be filtered as they enter a shielded PCB area. It is often possible to get valuable improvements using PCB shielding without such filtering, but this is difficult to predict. Therefore, filtering should always be designed-in (at least on prototypes, only being removed from the PCB layout after successful EMC testing).

The best filters are feedthrough types, but to save cost we need to avoid wired tynes. Leaded PCB-mounting types are available and can be soldered to a PCB in the usual manner. Then the leaded PCB mount is hand-soldered to the wall of the screening box when it is fitted at a later stage. Quicker assembly can be achieved by soldering the central contact of the filter to the underlying ground plane, making sure that solder joints between the shielding box and the same ground plane layer are close by on both sides. This latter construction also suits surface-mounted "feed-through" filters, further reducing assembly costs But feed-through filters, even surface mounted types, are still more expensive than simple ferrite beads or capacitors. To allow the most cost-effective filters to be found during development EMC testing, whilst also minimizing delay and avoiding PCB layout iterations, multipurpose pad patterns can easily be created to take any of the following filter configurations zero-ohm link (no filtering, often used as the starting point when EMC testing a new design); (2) a resistor or ferrite bead in series with the signal; a capacitor to the ground plane; (4) common-mode chokes; (5) resistor/ferrite/capacitor combinations (tee, LC, etc.); (6) feed-through capacitor (i.e. centre-pin grounded, not truly feed-through); (7) feedthrough filter (tee)LC, etc., centre-pin grounded, not truly feedthrough). Multipurpose padding also means we are not restricted to proprietary filters and can create our own to best suit the requirements of the circuit (and the product as a whole) at the lowest cost.

A proposed solution for hard-disk drive shielding has been proposed in U.S. patent application Ser. No. 10/417, 111, Publication U.S. 2003-222,550, now assigned to Xyratex, Ltd. of Havant, Great Britain, which is incorporated by reference for all purposes. However, the particular proposed solution in the referenced document does not easily provide reduced cost and assembly shielding solutions.

SUMMARY

The present invention provides a configuration of a hard-drive covering system and method for manufacturing in which a polymer including an electromagnetic interference shielding (EMI shielding) is configured such that shielding gaskets may be reduced or eliminated completely. Patterned "cuts" into one or more sides of a disk-drive holder made of Primeire® or another EMI shielding polymer material provides sufficient EMI shielding, having the result that shielding gaskets are not needed. In an alternate configuration of the invention, a computer box is provided with an inexpensive shielding solution

DRAWINGS

FIGS. 18A–E illustrate some electromagnetic interference shielding principles.

DETAILED DESCRIPTION

Figure 18A:
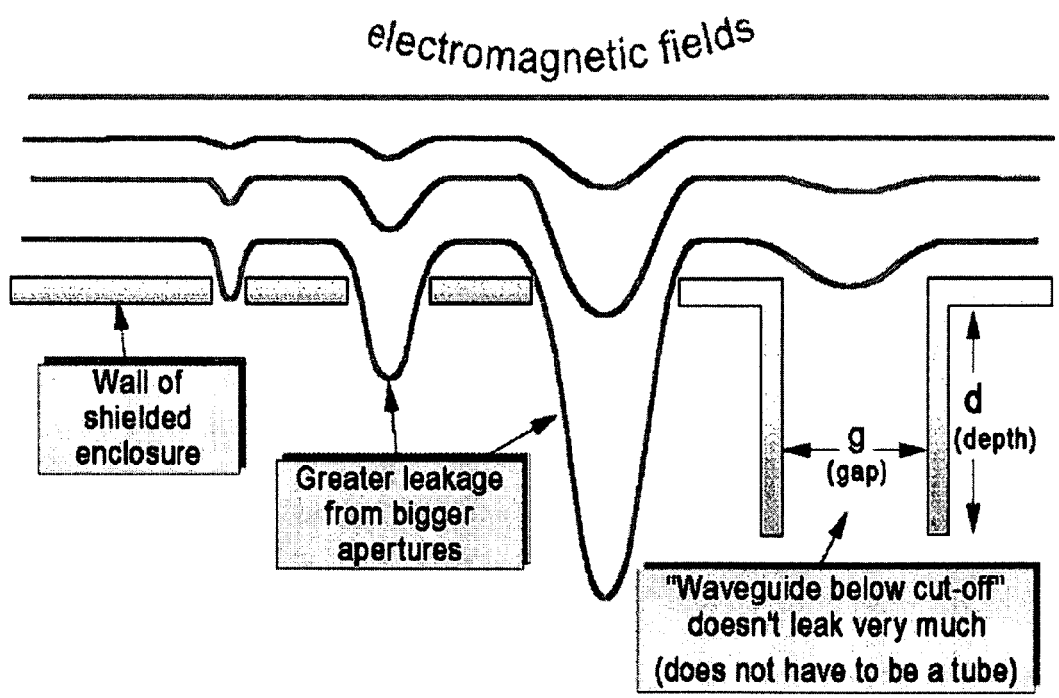
Figure 18D:
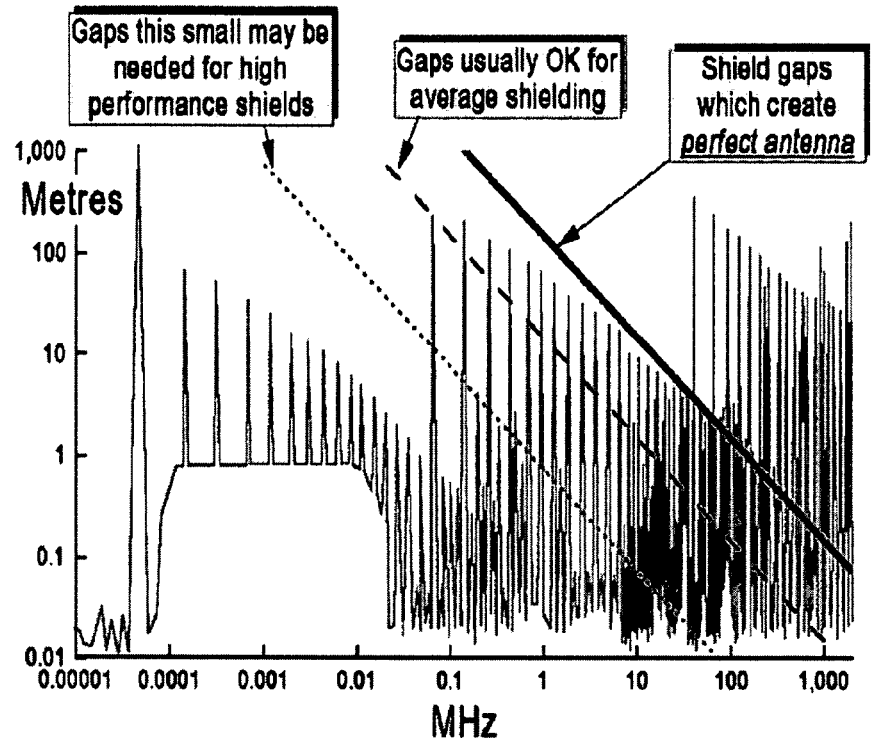
Figure 18E:
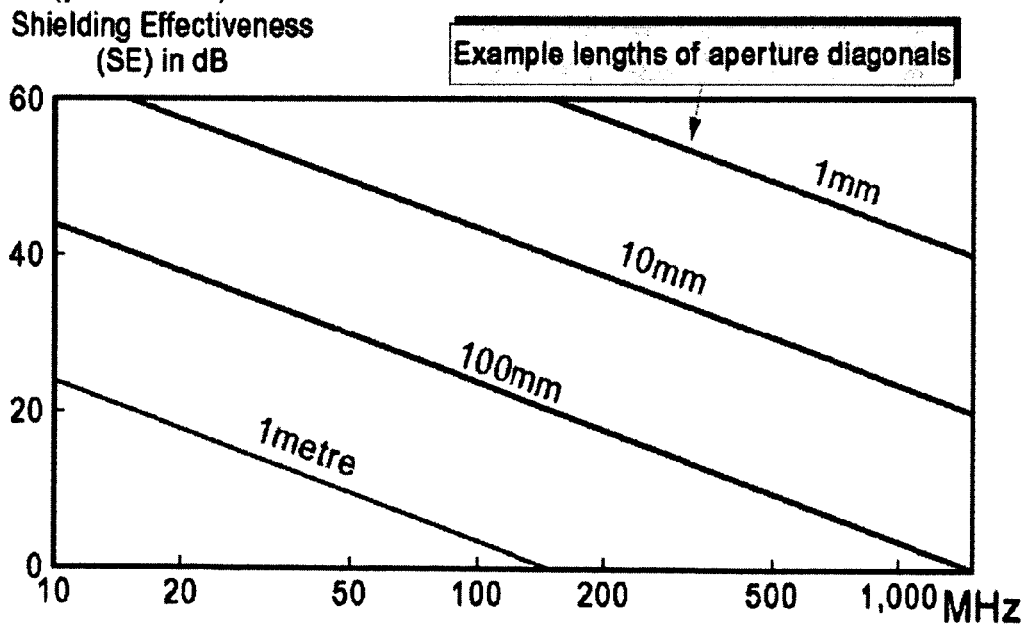

The half-wave resonance of slot antennae, expressed in the above rule of thumb, is the basis for the solid line in FIG. 18D (and for the rule-of-thumb of FIG. 18E) using the relationship: $SE=20 \log (\lambda/2d)$. Therefore the degradation associated with a multiple hole pattern is given by: SE reduction=$10 \log (N)$, where N=the # of holes in the pattern. Using the relationship: $f \cdot \lambda=c$, where is c the speed of light: $3\times10^8$ m/sec, the frequency in Hz, and $\lambda$ is the wavelength in meters, where: f=the frequency of the wave $\lambda$=the wavelength, c=the speed of light.

Shielding is the use of conductive materials to reduce EMI by reflection or absorption. Shielding electronic products successfully from EMI is a complex problem with three essential ingredients: a source of interference, a receptor of interference, and a path connecting the source to the receptor. If any of these three ingredients is missing, there is not an interference problem. Interference takes many forms such as distortion on a television, disrupted/lost data on a computer, or "crackling" on a radio broadcast. The same equipment may be a source of interference in one situation and a receptor in another.

Currently, the FCC regulates EMI emissions between 30 MHz and 2 GHz, but does not specify immunity to external interference. As device frequencies increase (applications over 10 GHz are becoming common), their wavelengths decrease proportionally, meaning that EMI can escape/enter very small openings (for example, at a frequency of 1 GHz, an opening must be less than ½ an inch). The trend toward higher frequencies therefore is helping drive the need for more EMI shielding. As a reference point, computer processors operate in excess of 250 MHz and some newer portable phones operate at 900 MHz.

Metals (inherently conductive) traditionally have been the material of choice for EMI shielding. In recent years, there has been a tremendous surge in plastic resins (with conductive coatings or fibers) replacing metals due to plastics many benefits. Even though plastics are inherently transparent to electromagnetic radiation, advances in coatings and fibers have allowed design engineers to consider the merits of plastics.

As a specific example, considering the FCC regulation to shield up to 2 GHz, a typical maximum clock speed in many of the controllers in the enterprise networks would be 400 MHz. If you consider the 2 GHz value as the maximum frequency of interest, then at 400 MHz you are saying that you will shield up to and including the 5th harmonic of a 400 MHz signal . . . i.e. 400 MHz*5=2 GHz (shielding to the 5th harmonic of maximum clock speed of 400 MHz).

To determine the wavelength at 2 GHz, utilize equation C, above: $f \cdot \lambda=c$, $\lambda=c/f$ $\lambda=(3\times108)/(2*109)$ $\lambda=0.15$ meters (at 2 GHz). Terms A & B are of interest with regard to the determination of a longest possible slot length $\lambda/2=0.075$ m or 75 mm. It is recommended that the apertures be kept to a range of approximately $\lambda/20$ to $\lambda/50$, therefore for 2 GHz, the apertures should be in the range of: $\lambda/20=0.0075$ meters or 7.5 mm maximum @ 2 GHz; $\lambda/50=0.003$ meters or 3.0 mm minimum @ 2 GHz.

Looking to equation from above, the shielding effectiveness for 1 hole of maximum length "X": $SE=20 \log (\lambda/2d)$ (there is no minimum—the smaller the better. This equation is used as a practical value for packaging.) @ 3 mm--->SE=$20 \log(0.15/(2 \cdot 0.003))=20 \log(25)=28$ dB'@ 7.5 mm--->SE=$20 \log(0.15/(2 \cdot 0.0075))=20 \log(10)=20$ dB Therefore, in a standard application where there are multiple holes—for example, a perfed 0.060" thick steel faceplate SE reduction=$10 \log (N)$ with a hole pattern of comprised of 100 holes. SE reduction=$10 \log (N)=10 \log (100)=20$ (please see FIG. 8 for a diagram). The result is that this will reduce the shielding to zero in the case of the 7.5 mm holes and it will reduce the shielding to 8 dB in the case of the 3 mm holes.

Figure 8:
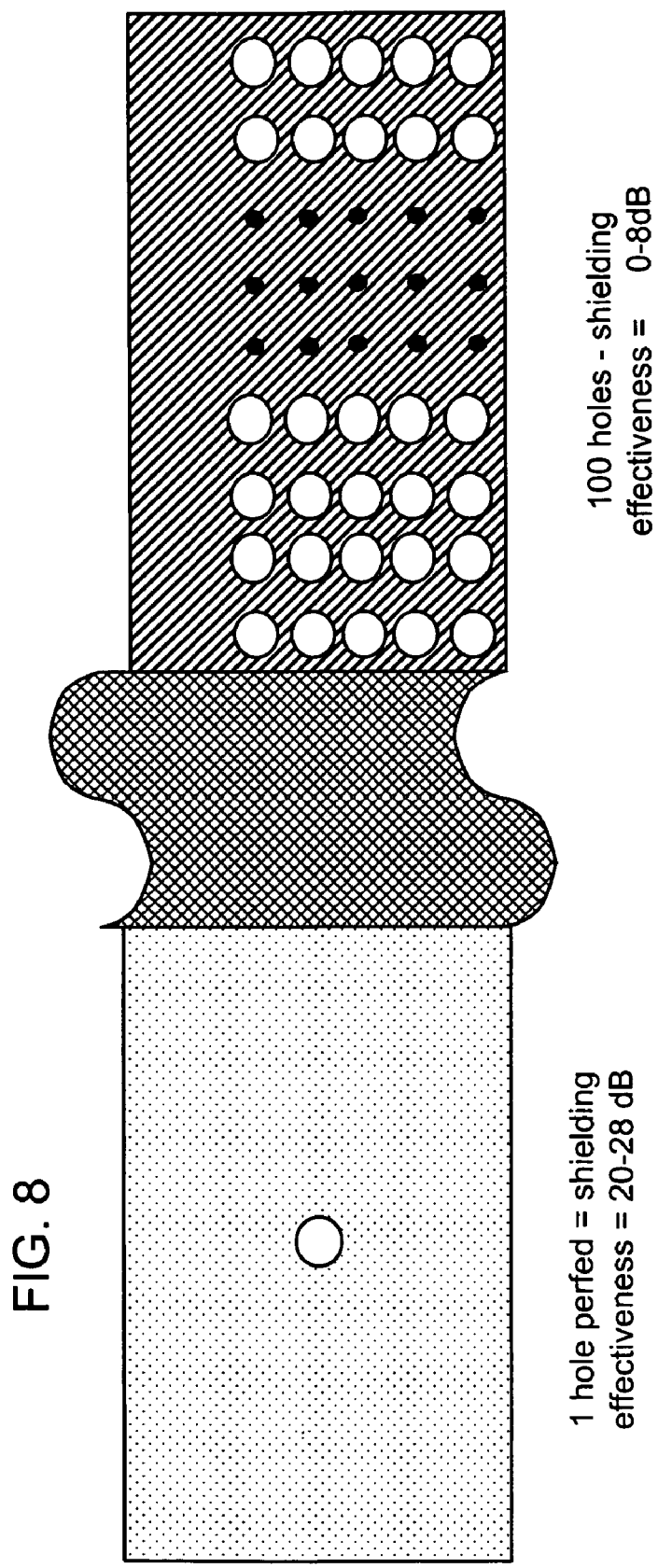
FIG. 8 illustrates the multiple "perfed hole" principle as it may be implemented in optional embodiments of the invention.

This is where the restrictive nature of EMI emerges and the interplay between getting cooling air in without letting magnetic interference out really becomes more significant. This is why honeycomb U-seams and waveguides are a desirable solution. One of the principles upon which the invention rests is illustrated by FIG. 8.

It is recommended that most packaging applications provide ~15 dB of shielding at the enclosure level. As is evident from the above information, this is far from easy to accomplish without an advance in the technology. It should be noted that the degradation described above does not even consider all the losses at seams where the gaskets are actually used. This is only the perf for airflow.

Figure 1A:
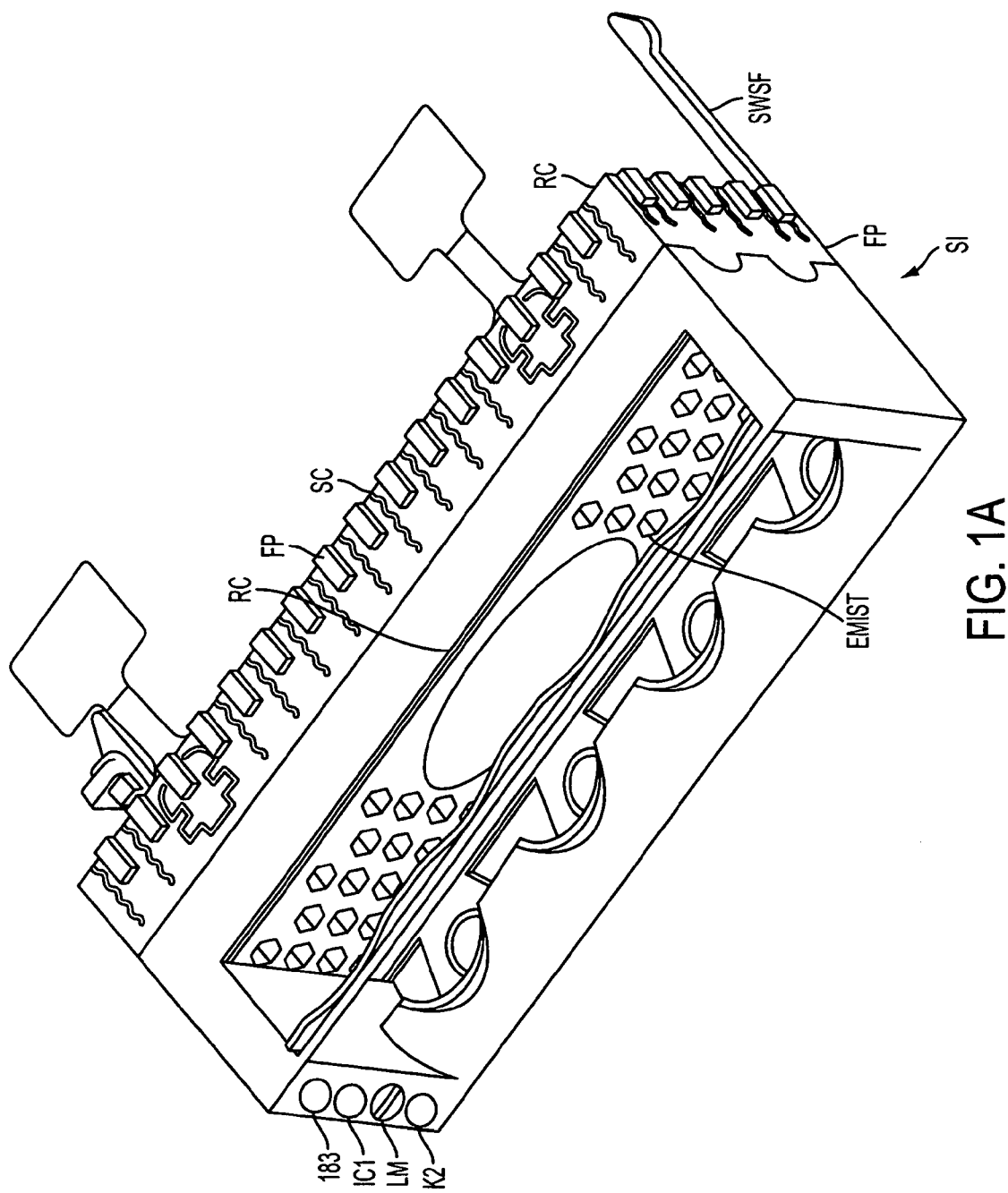
FIG. 1A illustrates the inventive gasket-less front plate of the hard-disk container system.

In order to implement some of the shielding solution discussed above for a hard disk drive, FIG. 1A shows a top-front overview of the front plate assembly 10 used for protection of the hard drive systems and providing sufficient electromagnetic interference (EMI) shielding. The front plate assembly 10 includes two separately manufacture-able portions each of which will able respectively made be made of two distinct materials providing two different functions.

A front cosmetic cover C is shown and can made of inexpensive plastic-molded polymer, which would be appropriate for use in such a cosmetic part. The cosmetic material cover C material will not provide any particular advantage regarding function of the EMI shielding solution, but is provided in order to keep the costs of the manufacturing material lower, as the front plate FP portion of the assembly will be made of an EMI shielding polymer in a preferred embodiment and, in general, will be much more expensive than the cosmetic cover C material. Although the cosmetic cover is made of a less expensive plastic material, in optional embodiments of the invention, the cosmetic cover structure C serves an important purpose in providing a locking system LM, and optional indicators IC1, IC2, IC3, which have structures that extend into the interior part of the front plate FP.

In general, the front plate FP part of the assembly, in a preferred embodiment of the invention is an appropriate polymer that provides EMI protection. One of the most desirable materials for this purpose is the material PREMIER® made by Chomerics of Woburn, Mass. This material provides nickel-plated fibrous carbon material, in a preferred embodiment which is appropriate for EMI shielding, but also can be efficiently and economically manufactured in the configurations required by the present invention. The technical specifications of this material which are included in the Appendix A to U.S. patent application Ser. No. 10/924,339, filed Aug. 23, 2004 and also assigned to owner of the present invention, and is incorporated by reference herein.

The front plate FP is configured to provide EMI shielding on all five sides, and is shown is several types of structures or cuts that are cut or molded into the shield material of the front plate FP.

The front plate can be attached to the cosmetic cover C by a number of methods or structures. However, a slip fit SF is shown on the right side of the face plate, in the preferred embodiment. The slip fit SF will generally be female in the cosmetic cover C and a single male tab in the face plate FP.

In general, it is desirable to make all of the structures that can be made from the less expensive material without significantly complicating the manufacturing process, due to the high cost of the shielding polymer. Other structures that provide important functionality may include the ¼-turn locking mechanism LM (see FIG. 7, discussed below), and the side-wall snap fit arms SWSF, shown extending from the bottom of the face plate portion FP. In a preferred embodiment, the ¼ locking mechanism LM and snap fit arms SWSF, are made from the less-expensive material that may also be including into the plastic mold or assembled separately, but should be a strong polymer sufficient to withstand stress and repeated replacements.

Figure 11:
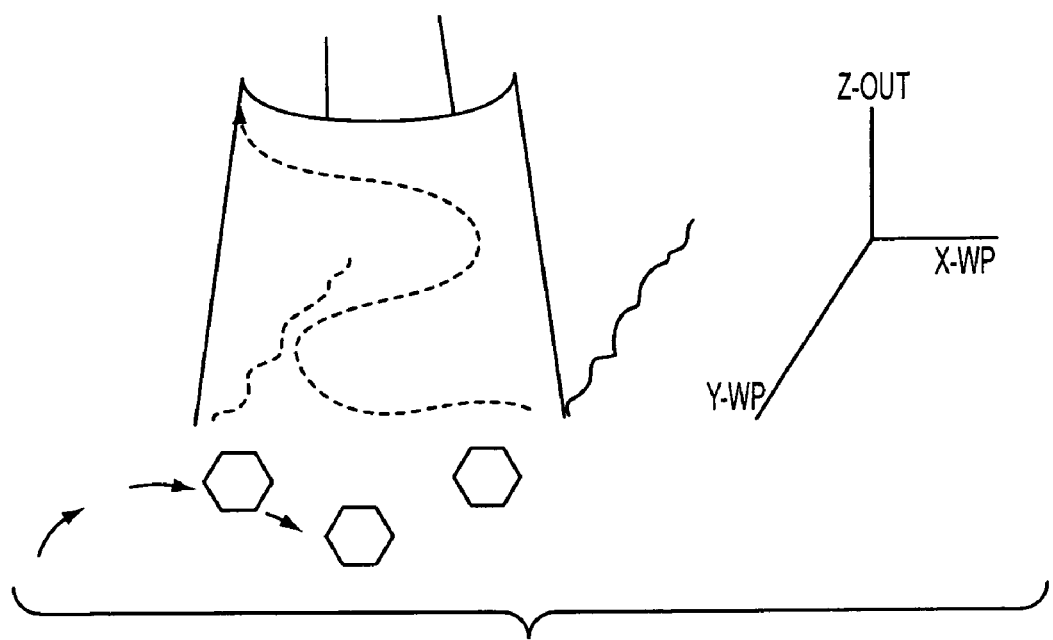
FIG. 11 illustrates the waveguide principle behind the bathtub tab structures and all directions.

The front panel FP of the face plate is shown in a "honeycomb" pattern with holes EMI-IST cut through the wall of the front of the panel P1. The honeycomb pattern is used in a preferred embodiment. However any configurations on the front panel P1 of the face plate may include other types of cuts or structures EMI-IST that are perpendicular to and therefore provide sufficient shielding in the direction of the wave propagation. This is illustrated by FIG. 11, which is discussed below. Other configurations that provide reduced or no gasket solutions with sufficient EMI shielding are discussed more fully below.

The shielding cuts SC are cut from the back towards the front plate along the four sides adjacent to the face plate FP. In a preferred embodiment, the shielding cuts are sinusoidal and each provide a target to place a tab structure TAB(s) on the outside edge, which has a bathtub structure SWG, which is discussed below in FIG. 2. The shielding cuts SC provide protection for EMI in the direction parallel along the sinusoidal cuts.

A second type of cut SC2T may interrupt the shielding cuts SC on one (or more) side, shown as the top side in a preferred embodiment. The second type of cut SC2T also provides sufficient EMI shielding, but also allows the additional structures to move into place through a rotational movement (see FIG. 5, discussed below). These rotating structures include the retaining clip RC and the release paddle RP, which is connected to the rear of the front plate FP via the retaining clip arm, which will be discussed in detail below.

Figure 1B:
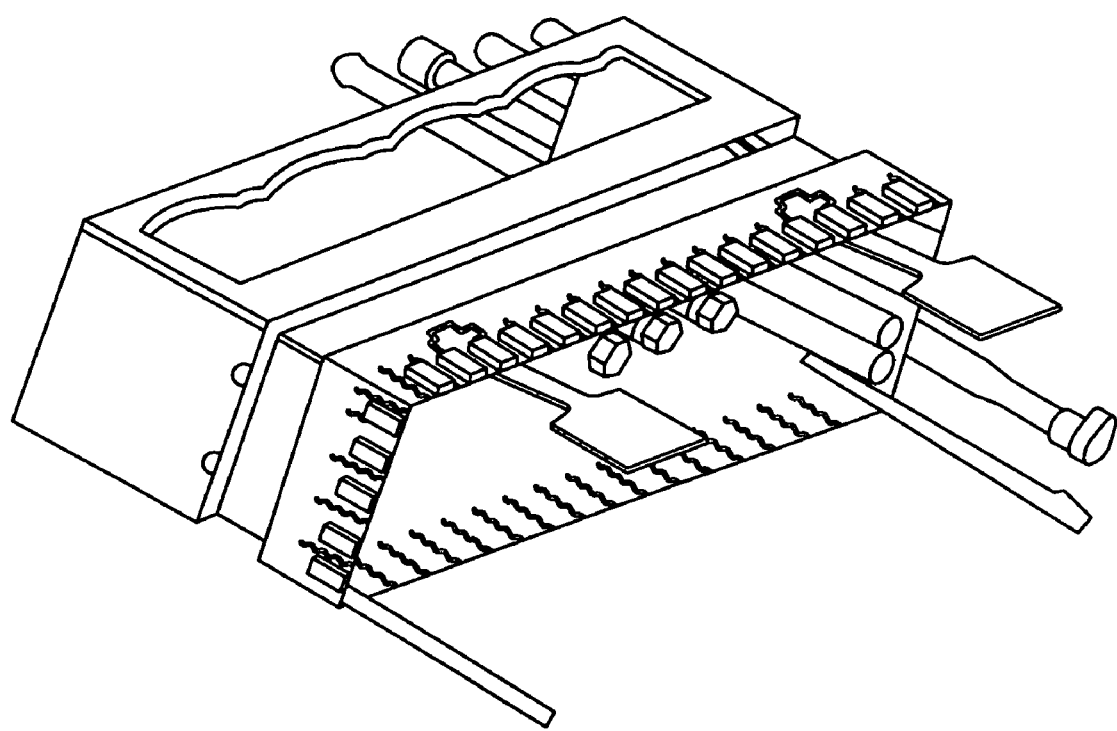
FIG. 1B is ½ bottom-rear view showing the underside of the rear part of the front plate shielding, release paddle, retainer clip and ¼ turn locking components.

FIG. 1B illustrates a rear side view of a preferred embodiment of the invention, and further shows the structural that continue from the front of the front plate FP to the interior.

Figure 2:
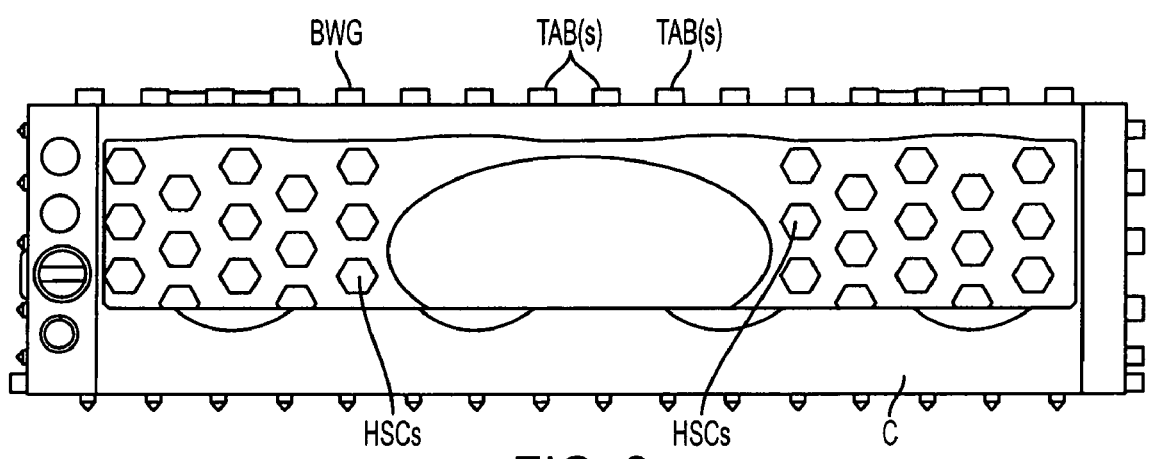
FIG. 2 is a detail of the front plate part of the removable part from a front view.

FIG. 2 shows a front view of the front plate assembly 10 that protects the hard disk drive while providing sufficient EMI shielding. The cosmetic front portion of the assembly C is shown as "housing" the EMI portion, of which is shown to be a "honeycomb" front piece with a specimen logo. The honeycomb front piece is cut or preferably molded with a shielding pattern which resembles "honeycomb" tubes or holes HSCs in a preferred embodiment. Although hex honeycomb shielding cuts HSCs are shown in FIG. 2, other honeycomb patterns may be used, such as circles, squares, pentagons, octagons, etc.

Figure 12A:
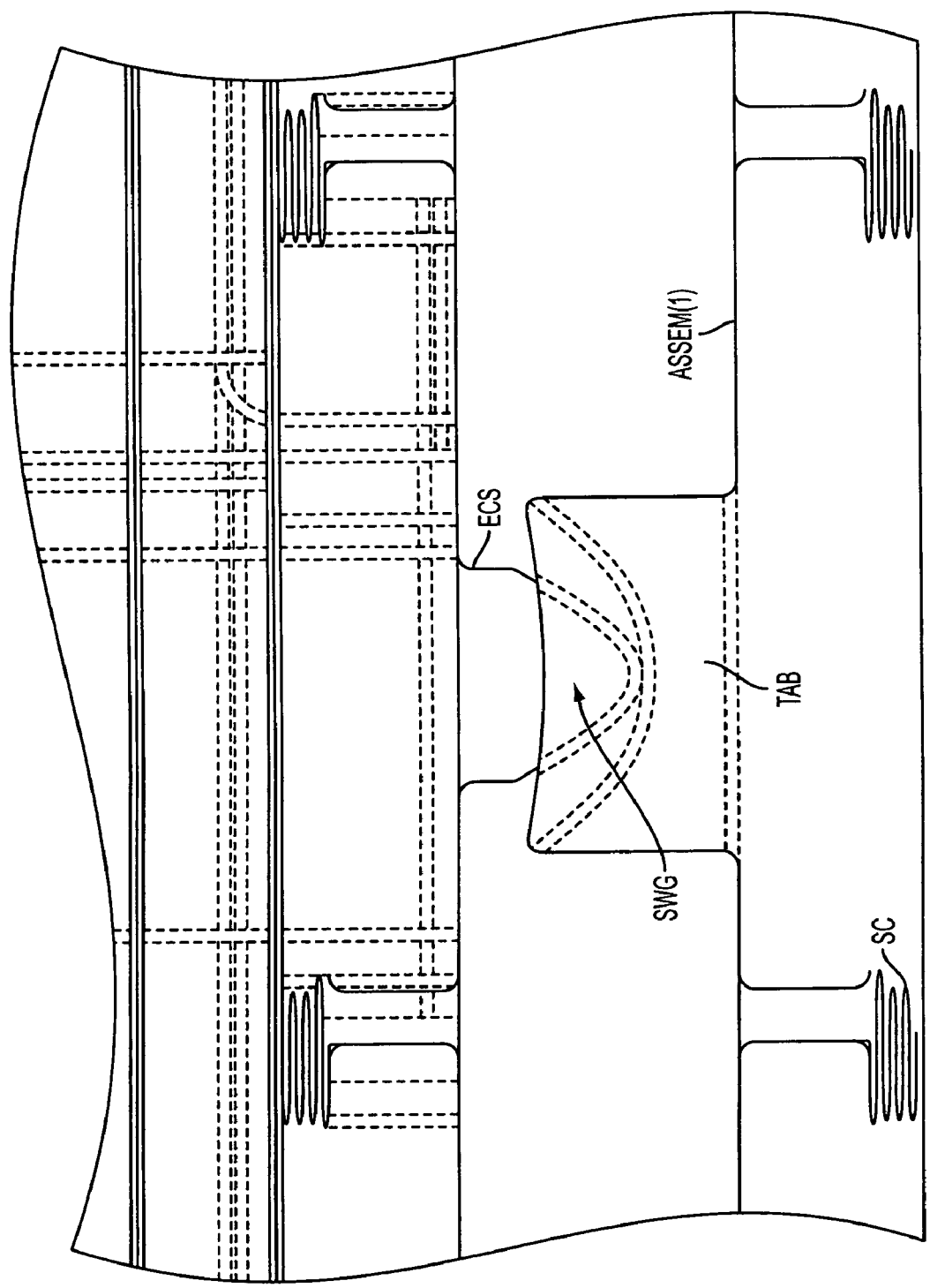
FIGS. 12A and 12B show the bathtub structures as they may function with other structures the assist in EMI shielding.
Figure 12B:
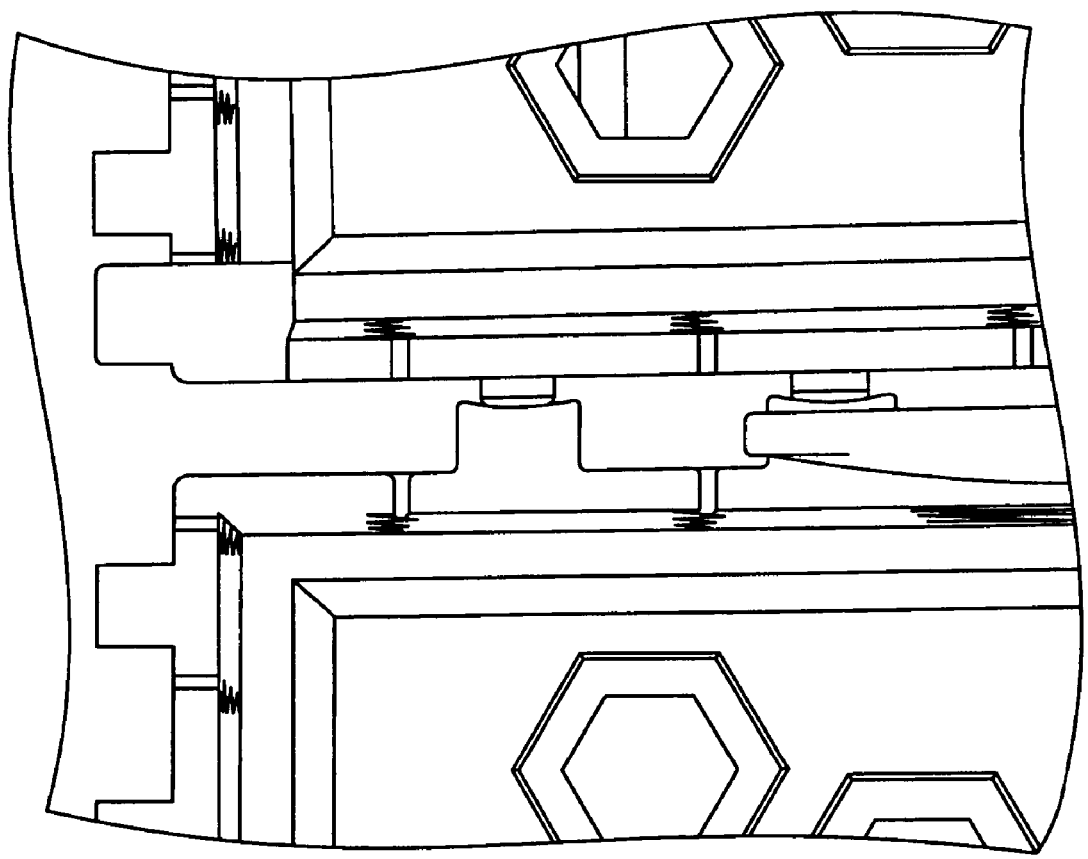

Also visible in FIG. 2 is the tab structure "TAB"(s) in the form of a "bathtub"-shaped or convex waveguide structure BWG. The convex configuration of the tab, allows shielding against waves being propagated in the positive or negative z-directions (out). The waves move into the structure and then are dampened by the convex part of the tab structure. This type of EMI shielding principle is illustrated in FIG. 11. Other electromagnetic shielding principles may also be implemented to take advantage of the configuration. For example, as shown in FIGS. 12A and 12B, in a full implementation with multiple assemblies, the tabs TAB(s) may be in electromagnetic contact with another structure ECS on the wall or another section to provide more EMI shielding.

Figure 3:
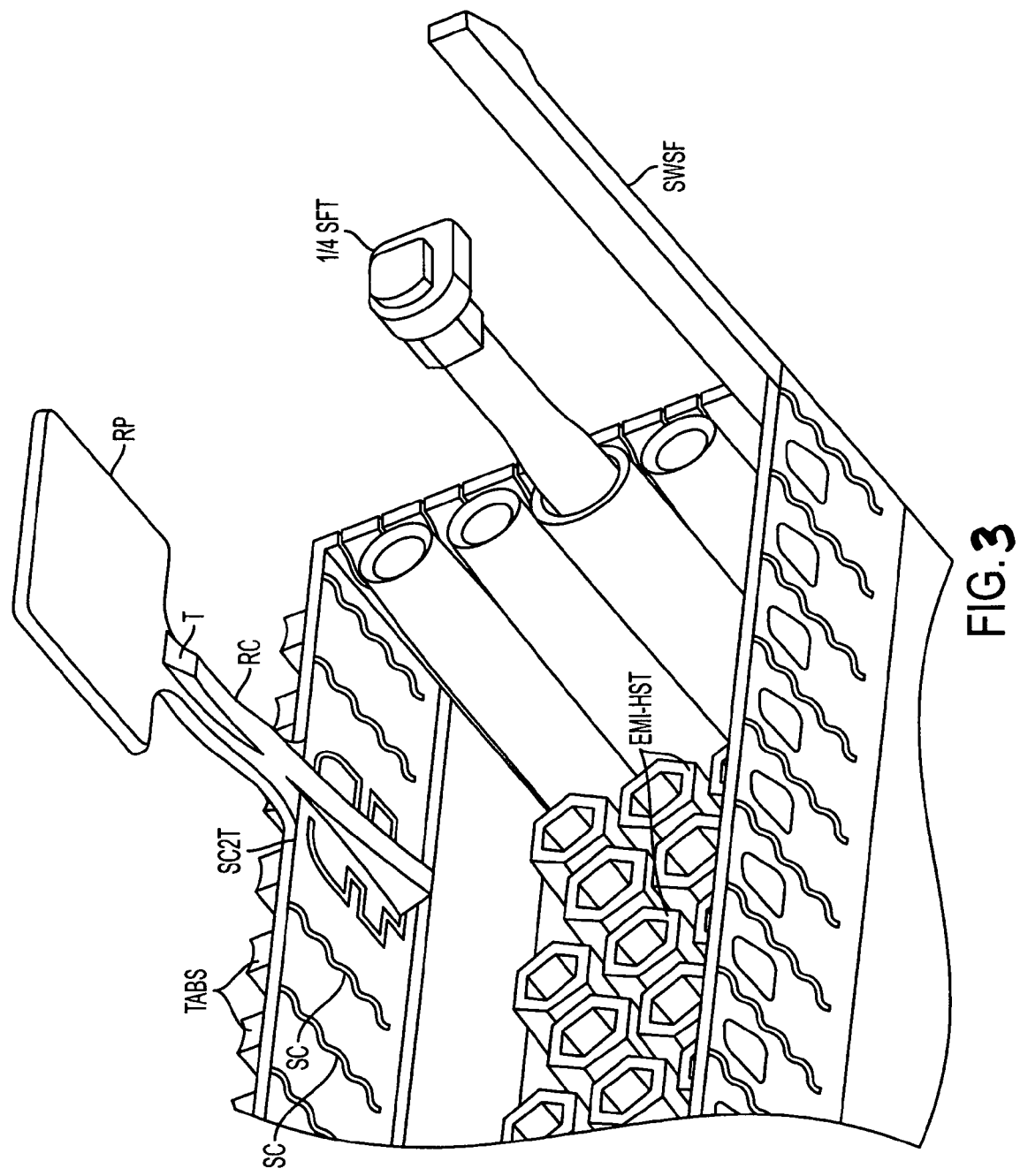
FIG. 3 is a rear opposite view of the detail of the interior configuration of the preferred embodiment of the invention.

FIG. 3 shows the detail of the back of the face plate FP of the inventive shielding container in a preferred embodiment. A series of cuts, or preferably shallow tubes designated as EMI-HST in a honeycomb pattern extending back from the front of the face plate provides excellent EMI shielding. A first type of cut, which is a sinusoidal cut SC, provides most of the TAB(s) structures, and is cut a target distance into the side of the faceplate around the circumference.

A second type of cut SC2T, is configured where the retainer clip arms meets the body of the face plate. The shape of this cut SC2T may be varied but allows for some torsion movement of the release paddle on the order of a few degrees without stressing the plastic. The second type of cut SPC allows torsion without compromising any shielding properties. The retainer clip RC has a tooth T at the base of the release paddle. The release paddle RP may include a small depression (not shown) to guide a finger.

Optional structures that allow for the implementation of a complete solution include the ¼ turn "snap-in" lock system ¼SFT. The side-wall snap fit SWSF. These features are not necessary for implementation of the EMI shielding feature(s) of the invention, but may be desirable when considered as part of an overall cost-reduction ease-of-manufacture.

Figure 4:
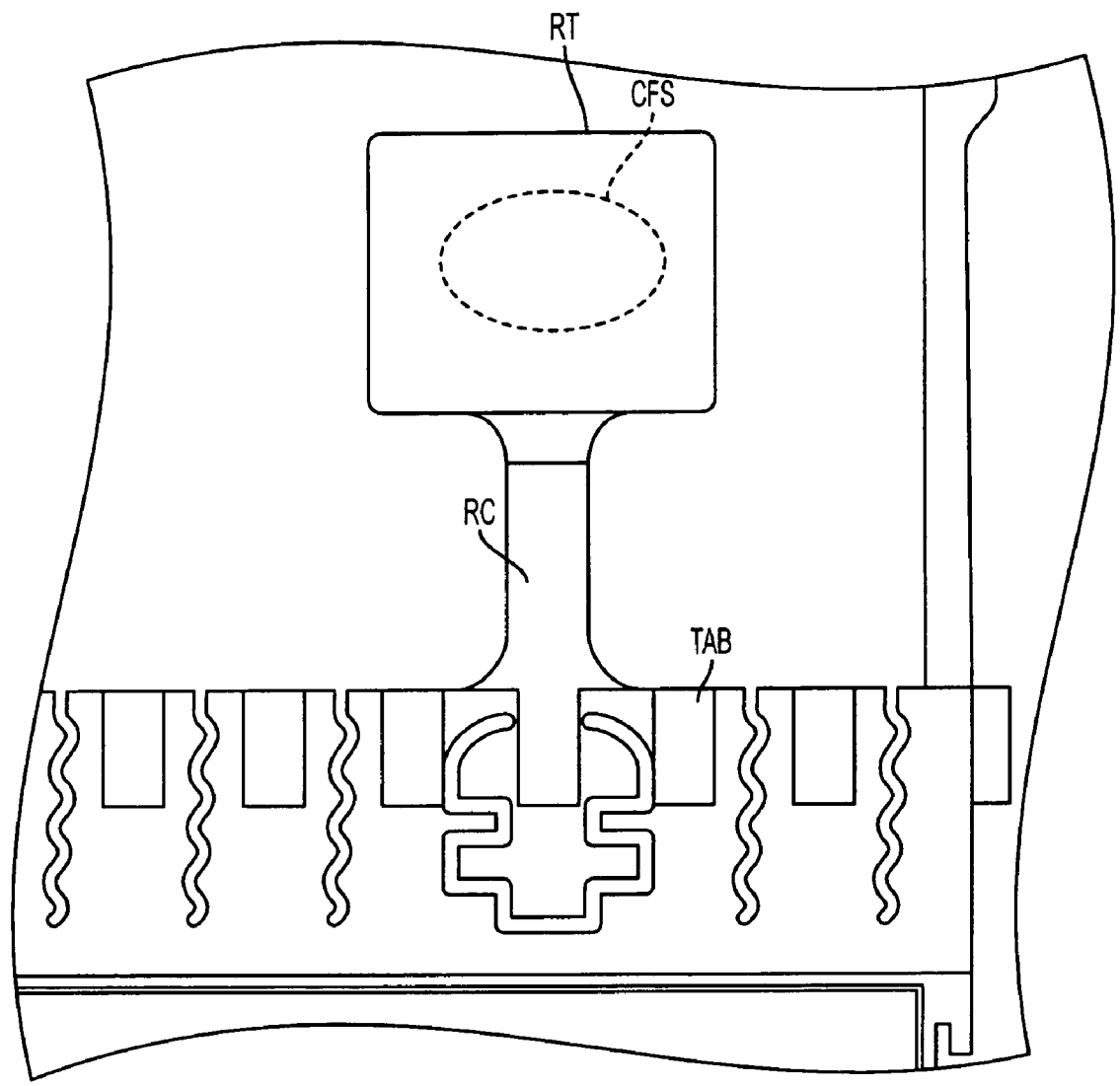
FIG. 4 is a detailed top view of the tab shielding and pressure tab.

FIG. 4 illustrates the top view detail of the retaining clip RC and release paddle RP. The second type of shielding cut is shown as a kind of "Chinese character cut" SC2T allowing for tortion(al) or rotational motion on the release clips RC of a few degrees, so that the front plate FP will slip into place. The release paddle RP may also have an optional finger guide sections CFS, which is a slightly convex surface in a preferred embodiment, generally on the order of the 0.03" depression, so that a user will be able to depress the release paddle properly.

Figure 5:
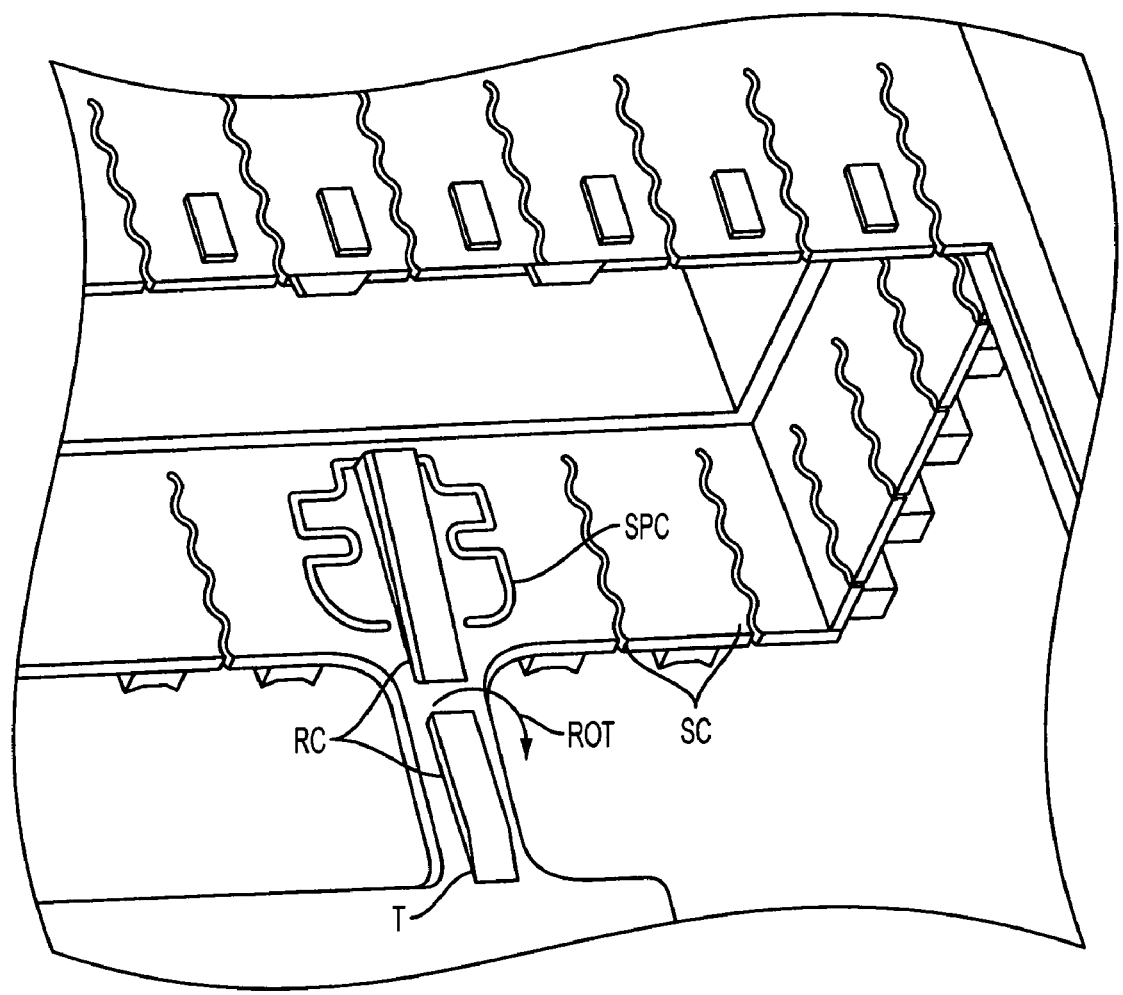
FIG. 5 is a detailed view of the underside of the top side of the interior front plate.

FIG. 5 further illustrates the invention and provides more detail of the back features of the face plate FP, include the inside of the release clip RC. The rotational motion Rot can be in either direction, and should only be a few degrees to prevent unnecessary stress on the retaining clip RC arm. The retaining clip RC arm may be configured a number of ways, but the 2-arc or 2-wedge configuration in which the arm is raised underneath the second type cut (see FIGS. 3 and 4, structure index SC2T) and narrows to a center point (not labeled) and "thickens" again to the tooth T which is located very close under the edge of the release paddle (not shown).

Figure 6:
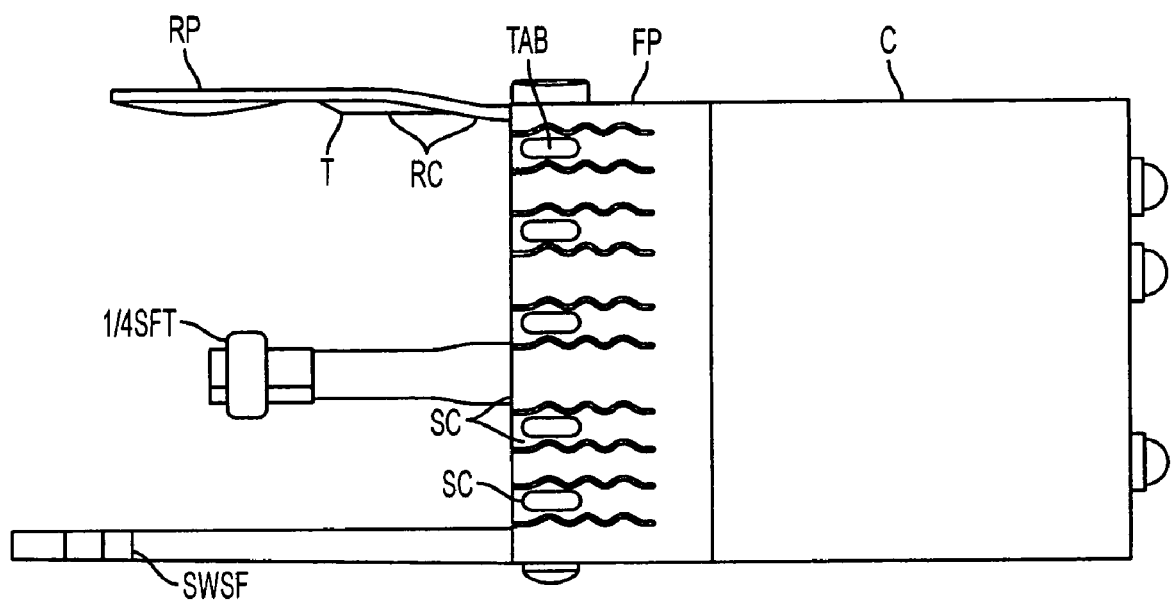
FIG. 6 is a side view of a primary embodiment of the invention.
Figure 7:
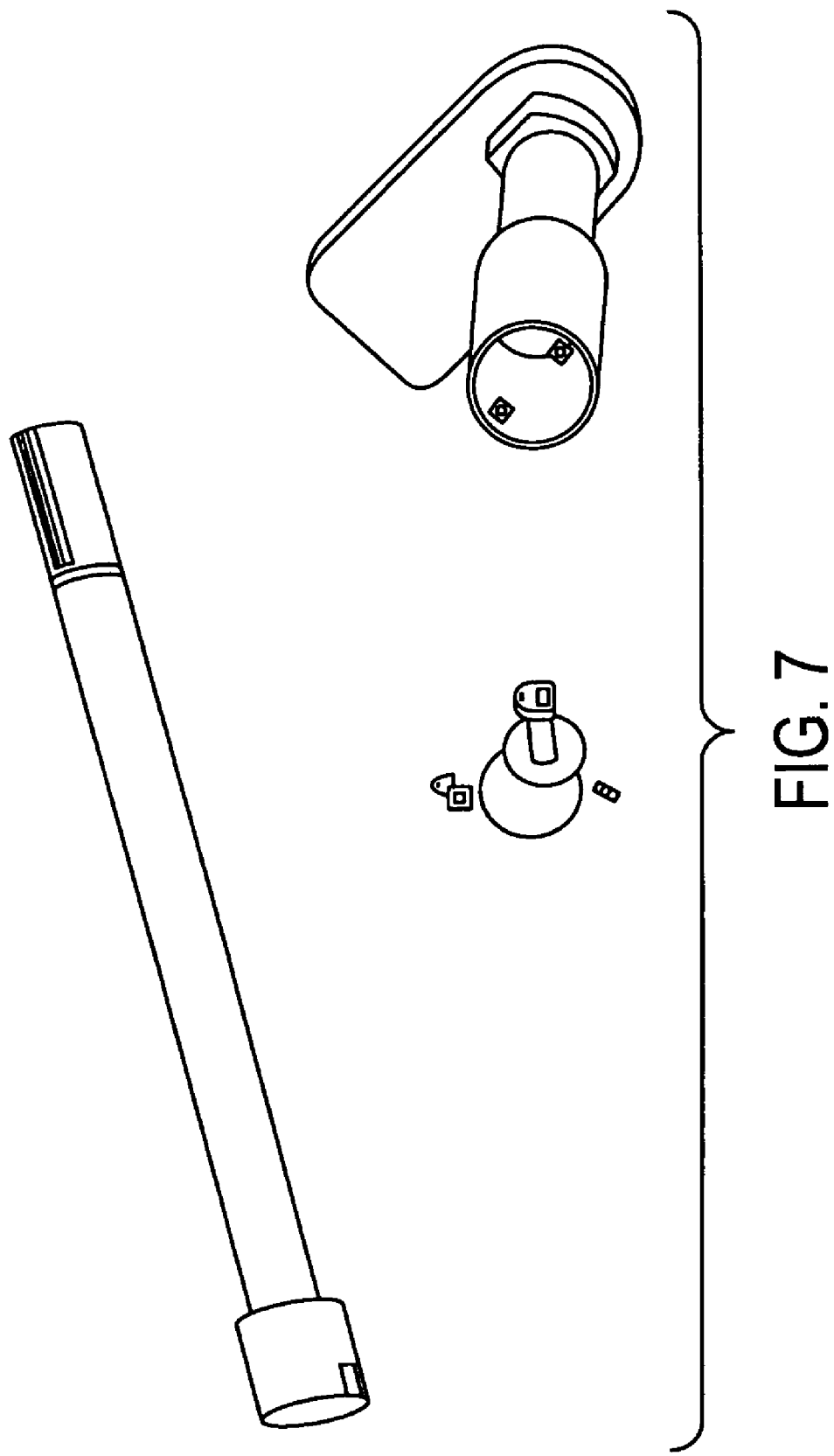
FIG. 7 shows a detail of an embodiment of the invention of the optional ¼-turn locking mechanism.

FIG. 6 illustrates the invention from the quarter-turn locking mechanism ¼ SFT side, from a side view. FIG. 7 illustrates an option ¼-turn locking mechanism ¼ SFT as it may be implemented with various embodiments of the invention. The quarter-turn locking mechanism provides the secure snap-fit in addition to the side-wall snap fits SWSF. The quarter-turn lock includes an emergency break-release (not shown), which should be operable only be a special tool (not shown) such that only specified technicians can release the hard drive when absolutely needed. One break-release solution is for the interior of the ¼-turn locking mechanism to have a small hollow tube on the order of the size a paper clip, which houses a break/catch BR/CA. This also may be facilitated if the ¼-turn locking mechanism has an inner and outer portion (not shown) in the two-piece snap fit model.

Other features illustrated are the female and male alignment keys (labeled), the ¼-turn lock is accessed through the cosmetic cover C in a preferred embodiment, but it is not necessary for the practice of the various embodiments of the invention.

In a first embodiment, the invention is a method for reducing or eliminating electromagnetic interference gasket shielding in a hard disk drive holder by providing a front panel made of an appropriate polymer for sufficient electromagnetic shielding of a disk drive, and cutting a series of holes or shallow tubes in said front panel in a honeycomb pattern, such that there are a plurality of tubes. Next, a set of first interruption patterns are cut a into the circumference of the body of the holder extending backward from the front pane. The body may be made of metal, but is made of an appropriate polymer, preferably with nickel-plated carbon fibers, such a Premier® by Chomerics. Next, a cutting step is performed (or through molding) resulting in a set of raised convex tab structures. Next, at least one retaining clips is provided and made of the appropriate polymer extending backward from the top of body connected to the body by a second type of interruption cut that allows a small rotation or tortional movement of the clip. The retaining clip is therefore capable of being rotated a target angle by a few degrees, from a first position and returning to said first position, and the release paddle supported by an arched spine forming the retainer clip. Preferably, the retainer clip, includes a tooth underneath.

In an assembly embodiment, the invention may be a reduced-gasket assembly for protecting or containing a disk drive that includes a polymer or metal body formed of a material that provides for sufficient electromagnetic interference (EMI) shielding. The front panel of the body is configured with a set of interference shielding structures, and at least one side adjacent to the front panel includes a first set of interference cuts patterns that are cut a target distance into said at least one side. In target embodiments, the set of shielding structures form a honeycomb, and the honeycomb includes circular or hex, rectangular holes, extending a target distance into the interior of said front plate.

The first set of interference cut patterns are periodic, and preferably sinusoidal and are generally cut around the periphery of all four sides adjacent to the front panel or, alternately, are cut around the periphery of all four sides adjacent to said front panel except in two locations. These particular locations, two, in a preferred embodiment, do not include a first type interference cut, but a second type of cut. The first set of interference cut patterns are generally cut around the periphery of all four sides adjacent to said front panel and cut at even distances. Preferred embodiments include at least one retaining structure operatively connected to one of the sides, most likely to "top" side. Once again, the tab structures formed between the first-type of sinusoidal cuts provides for shielding in the z-direction.

The retaining structure is generally connected to the second type of cut, and is preferably an arm configured, such that it may be twisted at least a few degrees, and further such that it is operatively connected to a flat structure at the end opposite the face plate. It is most desirable that no gaskets are present to provide the EMI shielding, and the EMI shielding material forming the front plate includes nickel-plated carbon and preferably Premier®.

The invention may also be viewed as a method for manufacturing an electromagnetic interference (EMI) shielding assembly as recited above, where the front plate is formed from a plastic mold injection system for reduced-cost manufacturing. In one embodiment, the invention is a reduced-gasket assembly for protecting a disk drive, including a polymer, or optionally, a body formed of a material that provides for sufficient electromagnetic interference (EMI) shielding, that includes a front panel configured with a set of interference shielding structures that form honeycomb tubes with a target depth. The honeycomb includes generally hex or cylindrical (circular) tubes. The invention may be embodied as an assembly for holding a disk drive providing electromagnetic interference (EMI) shielding, including a cosmetic front and a front plate capable of securely fitting into said cosmetic front, and formed from a polymer providing sufficient EMI shielding, configured to include a EMI shielding structures cut or formed into the front panel of the front plate, and a second type of EMI structures cut or formed into the four sides adjacent to the front panel, around the periphery of all four sides.

The cosmetic front is made from a second type of material that includes a polymer, said polymer not providing EMI shielding. The front plate includes nickel-plated carbon and preferably Premier® that provides the EMI shielding. The cosmetic front includes an operational structure for a quarter-turn locking mechanism. The quarter-turn locking mechanism operates to rotate a bolt made of bolting material 90 degrees, said bolt including a rotation lock, configured to catch on a structure in a side wall, and an optional tab structure on one front side of said front plate, and a reception structure on said cosmetic front.

A preferred embodiment generally includes the process of configuring the front plate to be locked into place by sliding said structures until a quarter-turn locking structure secures the front plate by locking into a sidewall. The quarter turn locking structure provides for snap fit into the side wall, and securing of the cosmetic cover piece.

Figure 9:
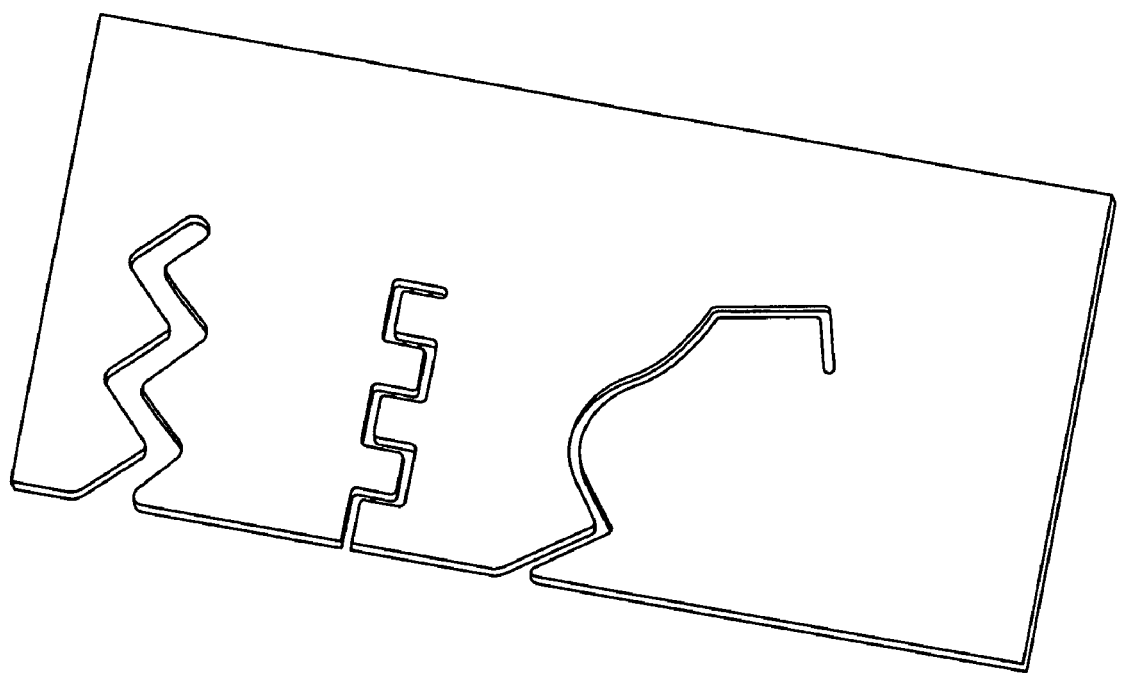
FIG. 9 illustrates another embodiment of the invention, the "four-cut" or TORTURED PATH™ solution.
Figure 10:
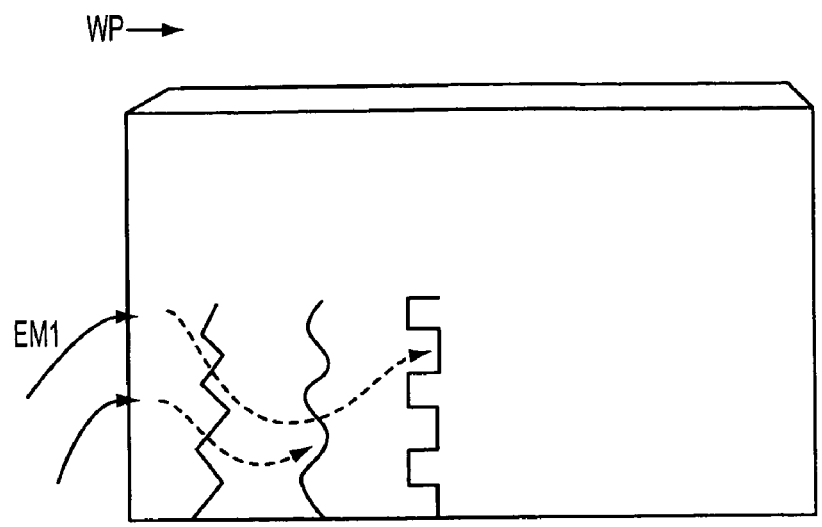
FIG. 10 illustrates the anti-snaking EMI shielding principle of the four-cut alternate embodiment.

FIG. 9 illustrates an alternate embodiment of the invention, known by the trade name of the TORTURED PATH™ EMI solution. Three cuts are shown in various shapes in the illustration, and four are used in a first type of the alternate embodiment. However, the cuts may be all of one type of cut, in appropriate patterns, such as sinusoidal, square wave, and certain Brownian-motion type cuts. The TORTURED PATH™ EMI solution provides a potentially complete EMI shielding solution in alternate embodiments as long as the four lines are placed to prevent any "snaking" of the sinusoidal wave propagation WP, shown in FIG. 10.

FIG. 11 illustrates the principle of the bathtub shaped waveguide TAB structures as well as illustrating the six-degrees of general shielding principle of the present invention, such that the shield occurs in all the directions. The shielding provided by the honeycomb front panel of the front plate occurs perpendicular to the wave propagation X-WP. The shielding provided by the sinusoidal cuts generally provided parallel to the direction of the cuts or Y-WP. The shielding provided by the bathtub or convex tabs occurs in all directions for EMI emanating from the interior of the hard drive.

FIGS. 12A and 12B illustrate how the bathtub structures TAB can be made to be in (electromagnetic) contact with another electromagnetic conductive/contact structure ECS in another assembly or sidewall, which makes volumetric and electromagnetic contact with the convex portion SWG of the bathtub shaped tab TAB of the front plate FP of the assembly Assem(1). FIG. 12B is an enlarged view of FIG. 12A in order to ascertain a sample scale and perspective of how the TAB and ECS structures are configured in a primary embodiment.

Figure 13:
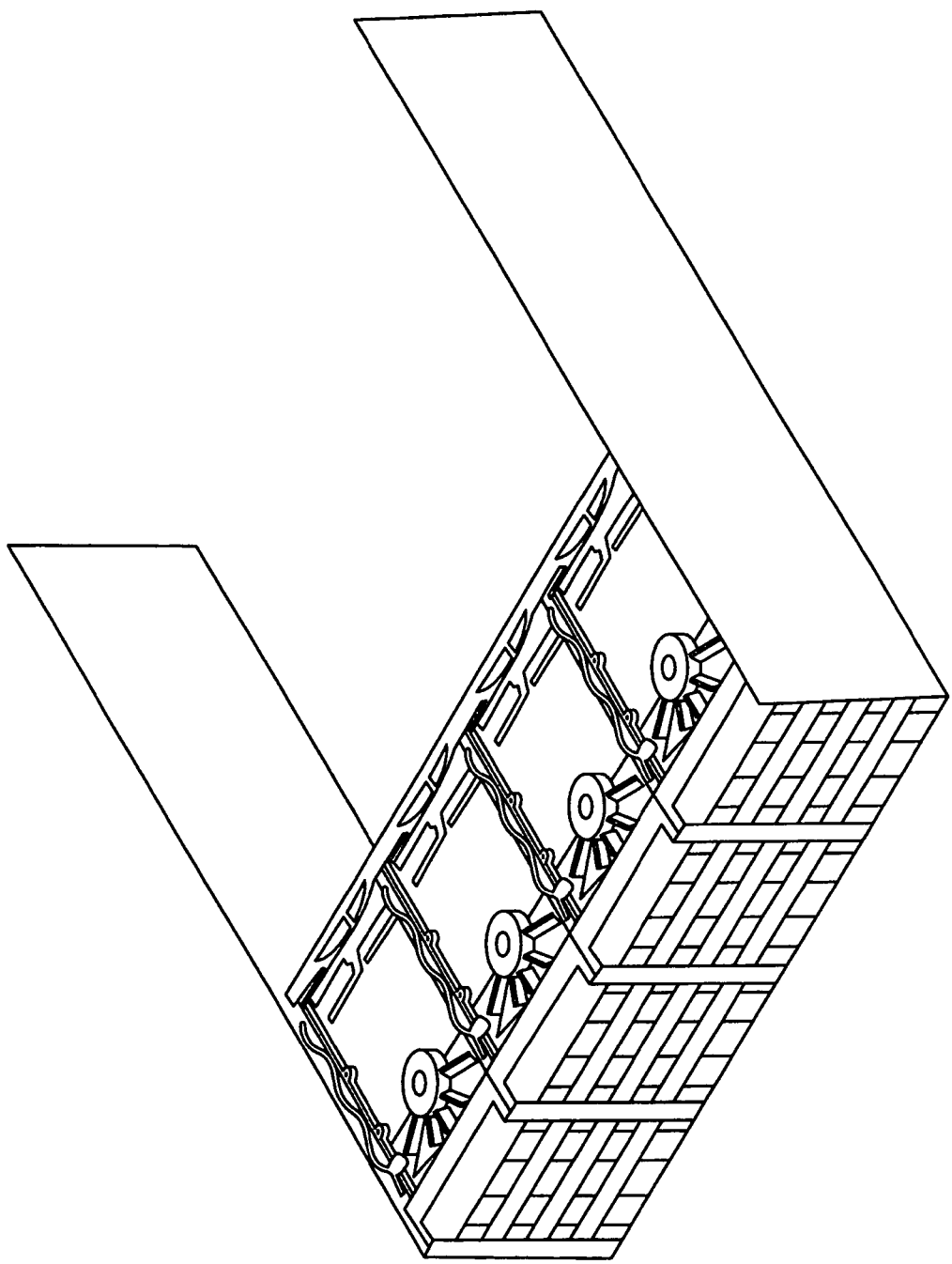
FIG. 13 illustrates a "box" of assemblies that may be implemented in an embodiment of the present invention.

FIG. 13 illustrates a "box" a hard-drive container assemblies as they may be implemented in a first embodiment of the invention. This is a particularly useful illustration for implementing the ECS/TABS contacts shown in FIGS. 12A and B for EMI shielding.

Figure 14A:
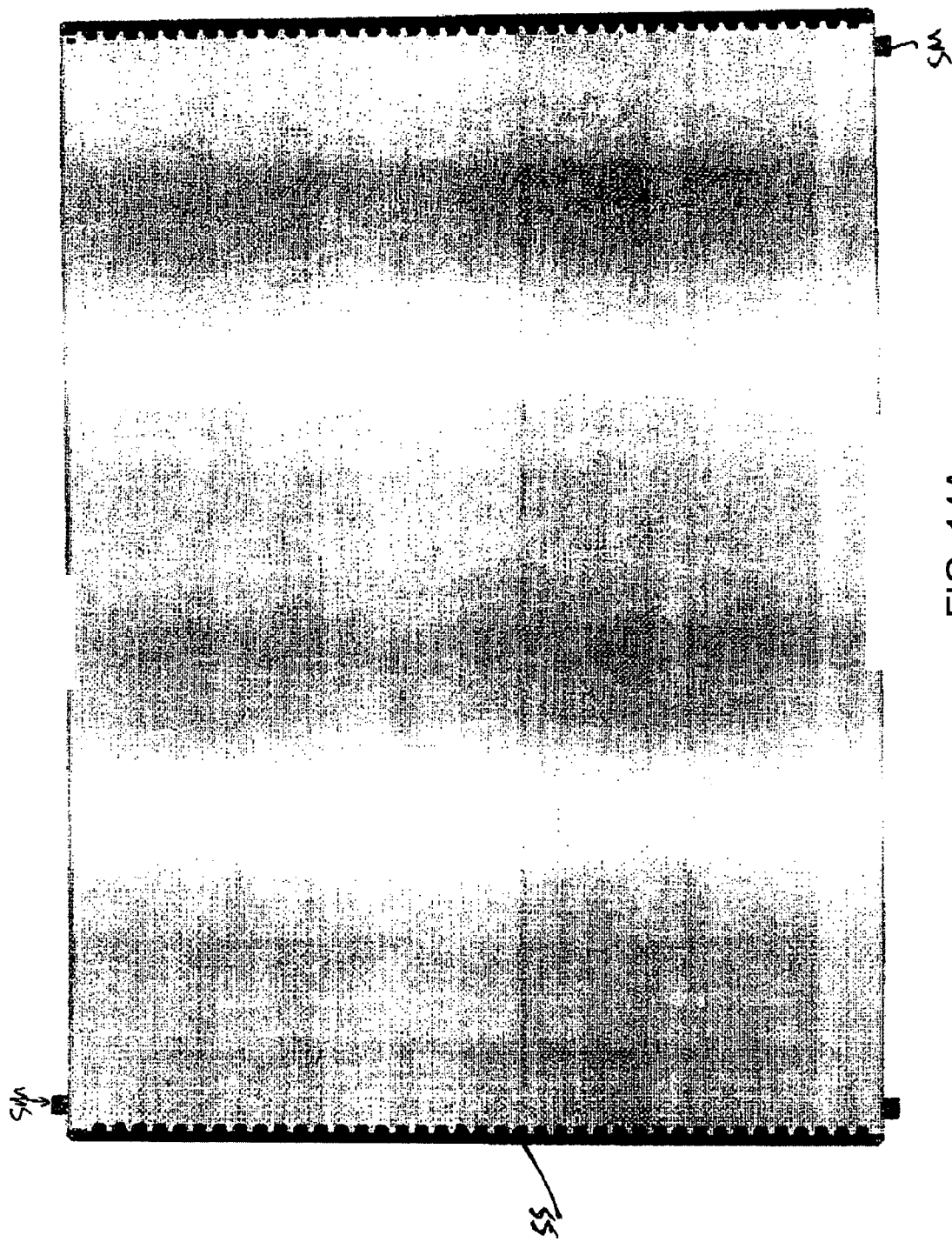
FIG. 14A illustrates a computer box shielding solution embodiment.
Figure 14B:
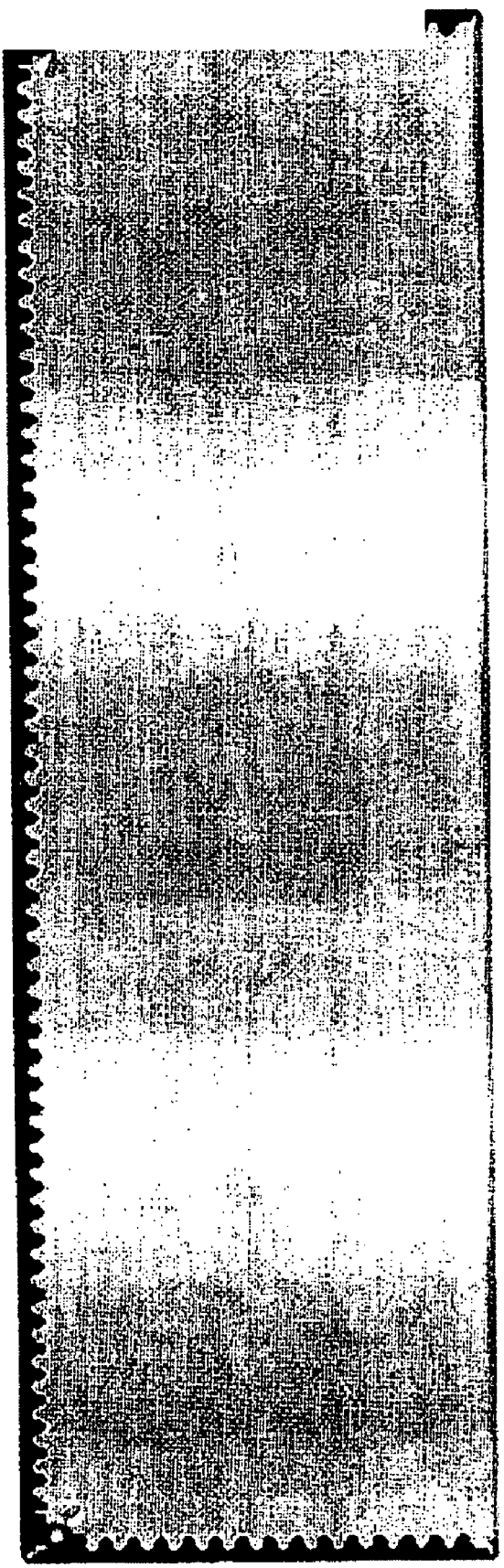
FIG. 14B illustrates an alternate view of the computer box shielding solution.

FIGS. 14A and 14B illustrate further embodiments of the invention in an alternate "PC Box" EMI shielding solution. The wave strip structure(s) IWG and OWG, respectively, are attached to the box, or manufactured with the box, and providing an inexpensive and easily implemented EMI shielding advantage.

Figure 15:
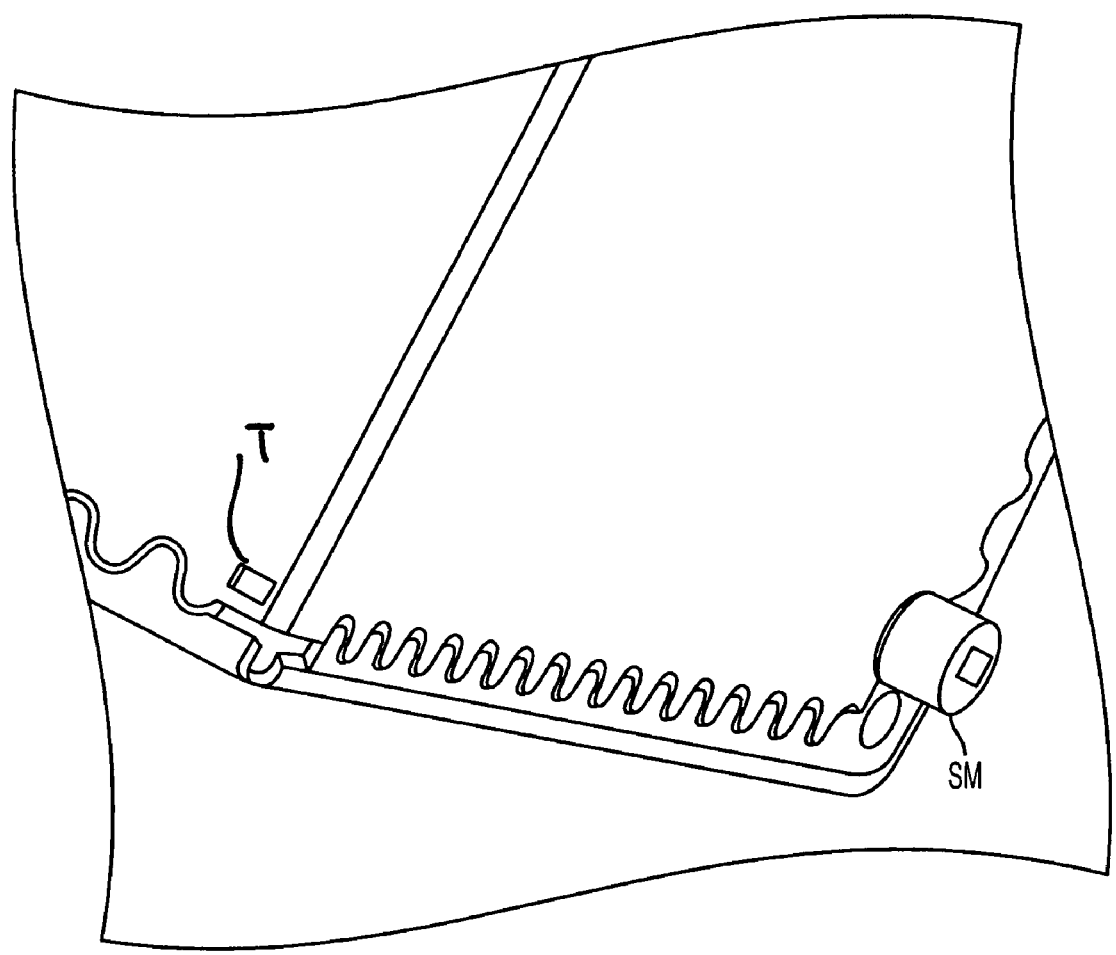
FIG. 15 illustrates corner detail of a computer box shielding solution.
Figure 16:
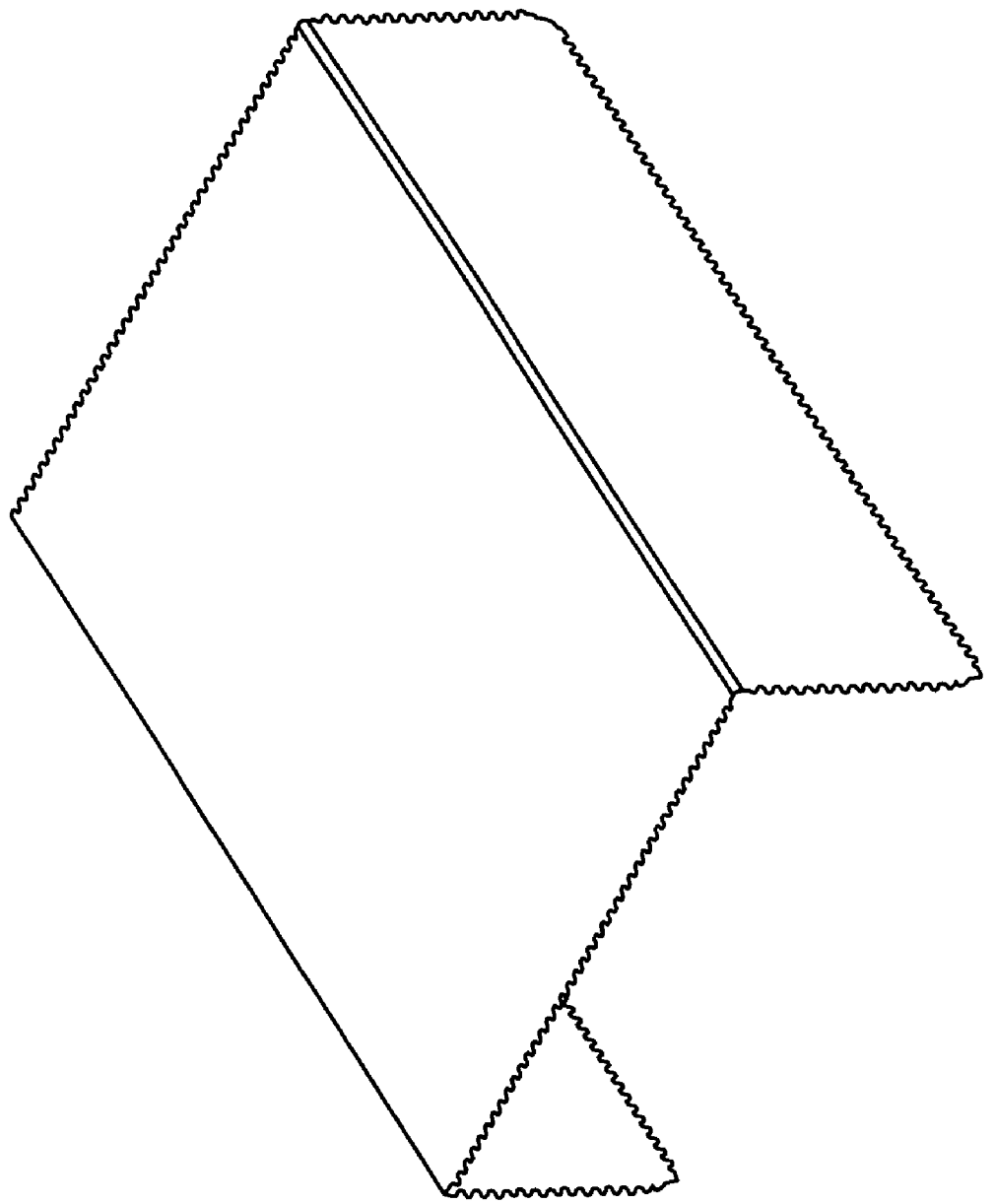
FIG. 16 illustrates a sample view of a partial interior of a computer box shielding solution.

FIG. 15 illustrates the detail of the computer box EMI shielding solution of the alternate embodiment of the invention. A waveguide structure includes and inner and outer portion IWG, and OWG, respectively. FIG. 16 illustrates an optional interior portion of a the sample computer box.

Figure 17:
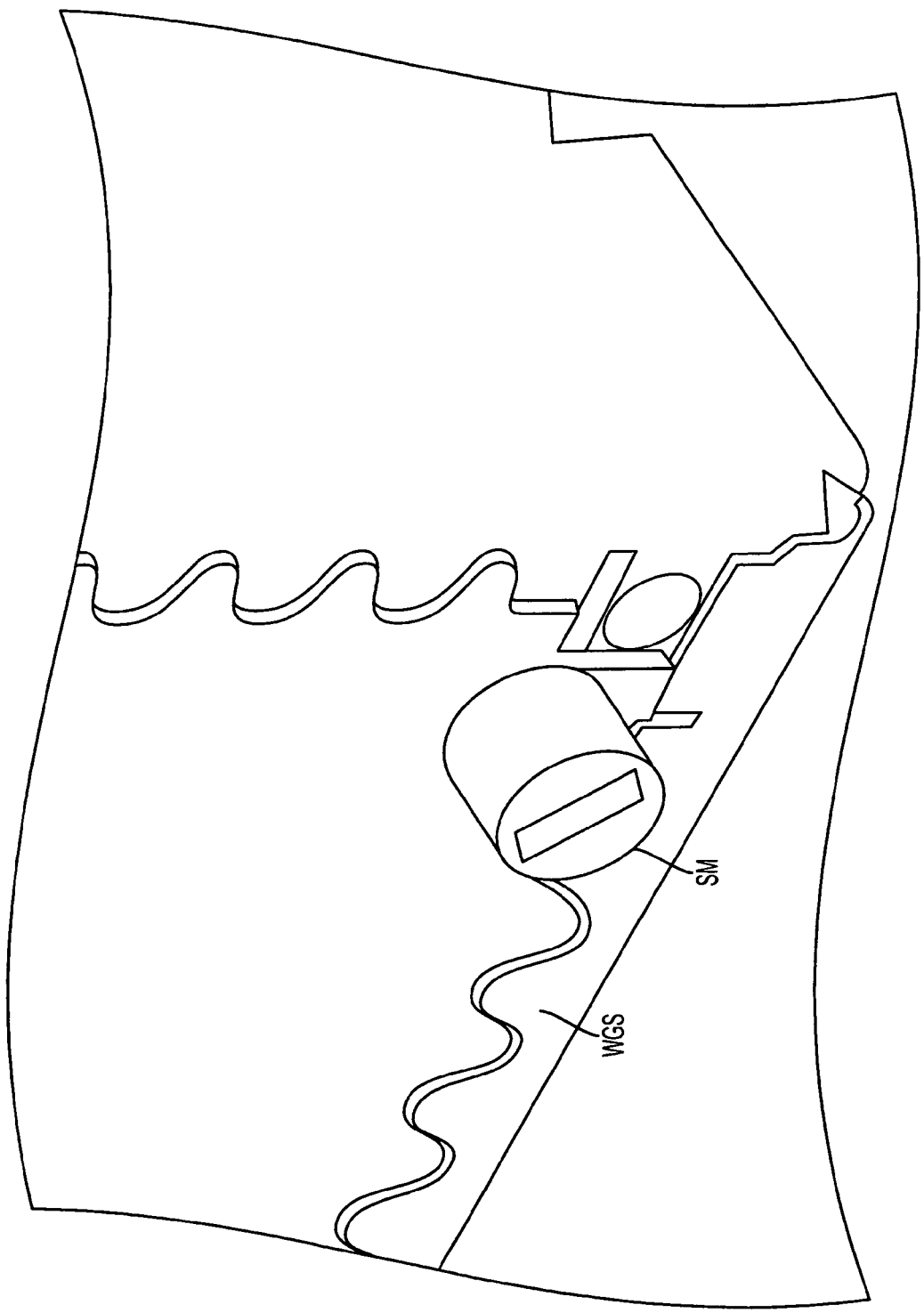
FIG. 17 illustrates the detail of a sample securing mechanism for the computer box shielding embodiment.

FIG. 17 shows a sample locking or securing mechanism as may be implemented in the computer box EMI shield embodiment of the invention.

Various embodiments of the invention may be configured in ways other than have been illustrated above, without departing from the scope and spirit of invention, nor is the present invention limited to computer components that require EMI shielding. The present invention is directed at reducing or eliminating the need for cumbersome and problematic EMI gasketting through the use of innovative configuration of materials that help reduce the cost of manufacture and assembly. Those skilled in the art should considered the claims recited below as defining the scope of the invention and not the above demonstrative examples, which are provided for illustrative purposes.

What is claimed is:

1. A method for reducing electromagnetic interference (EMI) gasket shielding in a hard disk drive container, including the steps of: providing a front plate, made of an appropriate material sufficient for EMI shielding from said disk drive; cutting a set of holes in a front panel of said front plate in a honeycomb pattern, such that there are a plurality of tube-like structures providing volumetric access to the interior of said front plate; cutting a set of first interruption pattern cuts into the body of said front plate on the sides adjacent to said front panel, extending from the back of said front plate towards said front panel; configuring said space between said cuts, such that a raised tab-like structure is positioned between said cuts.

2. The method as recited in claim 1, wherein said front plate is made of an appropriate polymer for EMI shielding that includes nickel-plated carbon fibers.

3. The method as recited in claim 1, further comprising the step of placing a plurality of containers in a grid-like position.

4. The method as recited in claim 3, further comprising the step of placing at least one tab-like structure on a first assembly in electromagnetic contact with a point on a second assembly.

5. The method as recited in claim 1, wherein the step of configuring said tab-like structure includes the act of creating a convex portion at the top of said tab-like structure.

6. The method as recited in claim 1, wherein the step of cutting the first interruption pattern cuts, includes the act of making a cut in the form of a periodic pattern.

7. The method as recited in claim 1, further comprising the act of coupling said face plate with a cosmetic cover made of a non EMI shielding material.

8. An electromagnetic interference (EMI) shielding device for a hard-disk drive unit including a body formed from a material sufficient to provide EMI shielding, said body including a front panel configured with a set of EMI shielding structures; said body including a first set of interference shielding cuts along at least one of any of the sides adjacent to said a front panel, said shielding cuts a target distance into said at least one side from the back to the front,
  wherein a shielding device, with a convex raised tab-shaped structure is in electromagnetic contact with a structure included on another assembly, further comprising a second set of interference cuts, at two locations along the top side adjacent to said front panel, said second set of interference cuts operatively connected to at least one arm extending backwards and capable of rotation of a target angle.

9. The shielding device as recited in claim 8, wherein said arm is configured such that the side facing the interior of said front plate is formed from two wedge-like structures.

10. The shielding device as recited in claim 9, wherein said at least one arm is connected to a release paddle structure.

* * * * *